US011868615B2

(12) United States Patent
Fukazawa et al.

(10) Patent No.: US 11,868,615 B2
(45) Date of Patent: Jan. 9, 2024

(54) COMPRESSION DEVICE AND CONTROL METHOD

(71) Applicant: Kioxia Corporation, Tokyo (JP)

(72) Inventors: Youhei Fukazawa, Kawasaki Kanagawa (JP); Kohei Oikawa, Kawasaki Kanagawa (JP); Sho Kodama, Kawasaki Kanagawa (JP); Keiri Nakanishi, Kawasaki Kanagawa (JP); Takashi Miura, Yokohama Kanagawa (JP); Daisuke Yashima, Tachikawa Tokyo (JP); Masato Sumiyoshi, Yokohama Kanagawa (JP); Zheye Wang, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/471,107

(22) Filed: Sep. 9, 2021

(65) Prior Publication Data

US 2022/0187994 A1    Jun. 16, 2022

(30) Foreign Application Priority Data

Dec. 14, 2020 (JP) ................. 2020-206930

(51) Int. Cl.
G06F 3/06 (2006.01)
H03M 7/30 (2006.01)

(52) U.S. Cl.
CPC .......... *G06F 3/0608* (2013.01); *G06F 3/0638* (2013.01); *G06F 3/0646* (2013.01); *G06F 3/0683* (2013.01); *H03M 7/3084* (2013.01)

(58) Field of Classification Search
CPC ...... G05B 13/00–048; G05B 15/00–02; G05B 17/00–02; G06F 1/00–3296;

(Continued)

(56) References Cited

U.S. PATENT DOCUMENTS 5,406,278 A    4/1995  Graybill et al.
5,821,882 A *  10/1998  Kazato ................ G06T 9/007
                                         341/51

(Continued)

FOREIGN PATENT DOCUMENTS

JP        6-83573      *   3/1994
JP    2007-133682 A       5/2007
JP      6319740 B2        5/2018

OTHER PUBLICATIONS

Welch, "A Technique for High-Performance Data Compression," in Computer, vol. 17, No. 6, pp. 8-19, Jun. 1984, doi: 10.1109/MC.1984.1659158. (Year: 1984).*

(Continued)

*Primary Examiner* — Daniel C. Chappell
(74) *Attorney, Agent, or Firm* — Allen & Overy LLP

(57) ABSTRACT

According to one embodiment, a compression device includes a first storage unit, a second storage unit, a calculation unit, and a comparison unit. The first storage unit stores addresses associated with hash values, respectively. The second storage unit includes storage areas specified by the addresses, respectively. The calculation unit determines a hash function to be used for first data in accordance with at least a part of the first data, and calculates a hash value using the hash function and at least a part of second data included in the first data. The comparison unit acquires third data from a storage area in the second storage unit specified by a first address, and compares the second data with the third data. The first address is stored in the first storage unit and is associated with the hash value.

15 Claims, 21 Drawing Sheets

(58) Field of Classification Search
CPC ............... G06F 3/00; G06F 3/06–0689; G06F 5/00–16; G06F 8/00–78; G06F 9/00–548; G06F 11/00–3696; G06F 12/00–16; G06F 13/00–4295; G06F 15/00–825; G06F 16/00–986; G06F 17/00–40; G06F 21/00–88; G06F 2009/3883; G06F 2009/45562–45595; G06F 2015/761–768; G06F 2201/00–885; G06F 2206/00–20; G06F 2209/00–549; G06F 2211/00–902; G06F 2212/00–7211; G06F 2213/00–4004; G06F 2216/00–17; G06F 2221/00–2153; G06K 9/00–6298; G06N 3/00–126; G06N 5/00–048; G06N 7/00–08; G06N 10/00; G06N 20/00–20; G06N 99/00–007; G06T 1/00–60; G06V 30/00–43; G11B 20/00–24; G11B 33/00–1493; G11C 11/00–5692; G11C 13/00–06; G11C 14/00–009; G11C 15/00–06; G11C 16/00–3495; G11C 17/00–18; G11C 2207/00–229; G11C 2216/00–30; H01L 25/00–50; H01L 27/00–3293; H01L 2225/00–1094; H03M 7/00–707; H04L 9/00–38; H04L 12/00–66; H04L 41/00–5096; H04L 49/00–9094; H04L 61/00–59; H04L 67/00–75

See application file for complete search history.

(56) References Cited

U.S. PATENT DOCUMENTS

| | | | |
|---|---|---|---|
| 6,975,992 B2 * | 12/2005 | Tucker | H04H 20/31 726/1 |
| 7,613,669 B2 | 11/2009 | Shin et al. | |
| 7,970,216 B2 * | 6/2011 | Bashyam | H04N 19/17 382/233 |
| 7,982,636 B2 | 7/2011 | Abali et al. | |
| 9,367,557 B1 * | 6/2016 | Lin | G06F 16/1744 |
| 9,411,815 B1 * | 8/2016 | Lu | G06F 11/1453 |
| 9,524,104 B2 * | 12/2016 | Chatterjee | G06F 3/065 |
| 9,882,582 B2 * | 1/2018 | Kataoka | H03M 7/6029 |
| 10,216,754 B1 * | 2/2019 | Douglis | G06F 16/1744 |
| 11,309,908 B2 * | 4/2022 | Billa | H03M 7/3088 |
| 11,593,286 B2 * | 2/2023 | Nakanishi | H03M 7/6029 |
| 11,714,552 B2 * | 8/2023 | Kodama | H03M 7/6047 711/103 |
| 2007/0027867 A1 | 2/2007 | Ichino | |
| 2011/0081019 A1 * | 4/2011 | Takagi | H04N 21/4405 380/268 |
| 2011/0145207 A1 * | 6/2011 | Agrawal | G06F 16/1748 707/E17.002 |
| 2014/0258245 A1 * | 9/2014 | Estes | G06F 16/1748 707/692 |
| 2015/0280736 A1 | 10/2015 | Ogasawara et al. | |
| 2017/0156678 A1 * | 6/2017 | Lim | A61B 5/316 |
| 2022/0187994 A1 * | 6/2022 | Fukazawa | H03M 7/6029 |
| 2023/0006689 A1 * | 1/2023 | Sumiyoshi | G06F 3/0608 |
| 2023/0057492 A1 * | 2/2023 | Kothandaraman | G06T 9/001 |

OTHER PUBLICATIONS

T. Bell, "Better OPM/L Text Compression," in IEEE Transactions on Communications, vol. 34, No. 12, pp. 1176-1182, Dec. 1986, doi: 10.1109/TCOM.1986.1096485. (Year: 1986).*

Machine translation of JP-6-83573; retrieved from https://www.j-platpat.inpit.go.jp/p0200 on Sep. 28, 2022 (Year: 1994).*

S. Dolev, S. Frenkel and M. Kopeetsky, "Entropy Adaptive On-Line Compression," 2014 IEEE 13th International Symposium on Network Computing and Applications, Cambridge, MA, USA, 2014, pp. 162-166, doi: 10.1109/NCA.2014.31. (Year: 2014).*

I. Horev, O. Bryt and R. Rubinstein, "Adaptive image compression using sparse dictionaries," 2012 19th International Conference on Systems, Signals and Image Processing (IWSSIP), Vienna, Austria, 2012, pp. 592-595. (Year: 2012).*

L. Foschini, R. Grossi, A. Gupta and J. S. Vitter, "Fast compression with a static model in high-order entropy," Data Compression Conference, 2004. Proceedings. DCC 2004, Snowbird, UT, USA, 2004, pp. 62-71, doi: 10.1109/DCC.2004.1281451. (Year: 2004).*

A. K. M. Al-Qurabat, A. K. Idrees and C. A. Jaoude, "Dictionary-Based DPCM Method for Compressing IoT Big Data," 2020 International Wireless Communications and Mobile Computing (IWCMC), Limassol, Cyprus, 2020, pp. 1290-1295, doi: 10.1109/IWCMC48107.2020.9148492. (Year: 2020).*

* cited by examiner

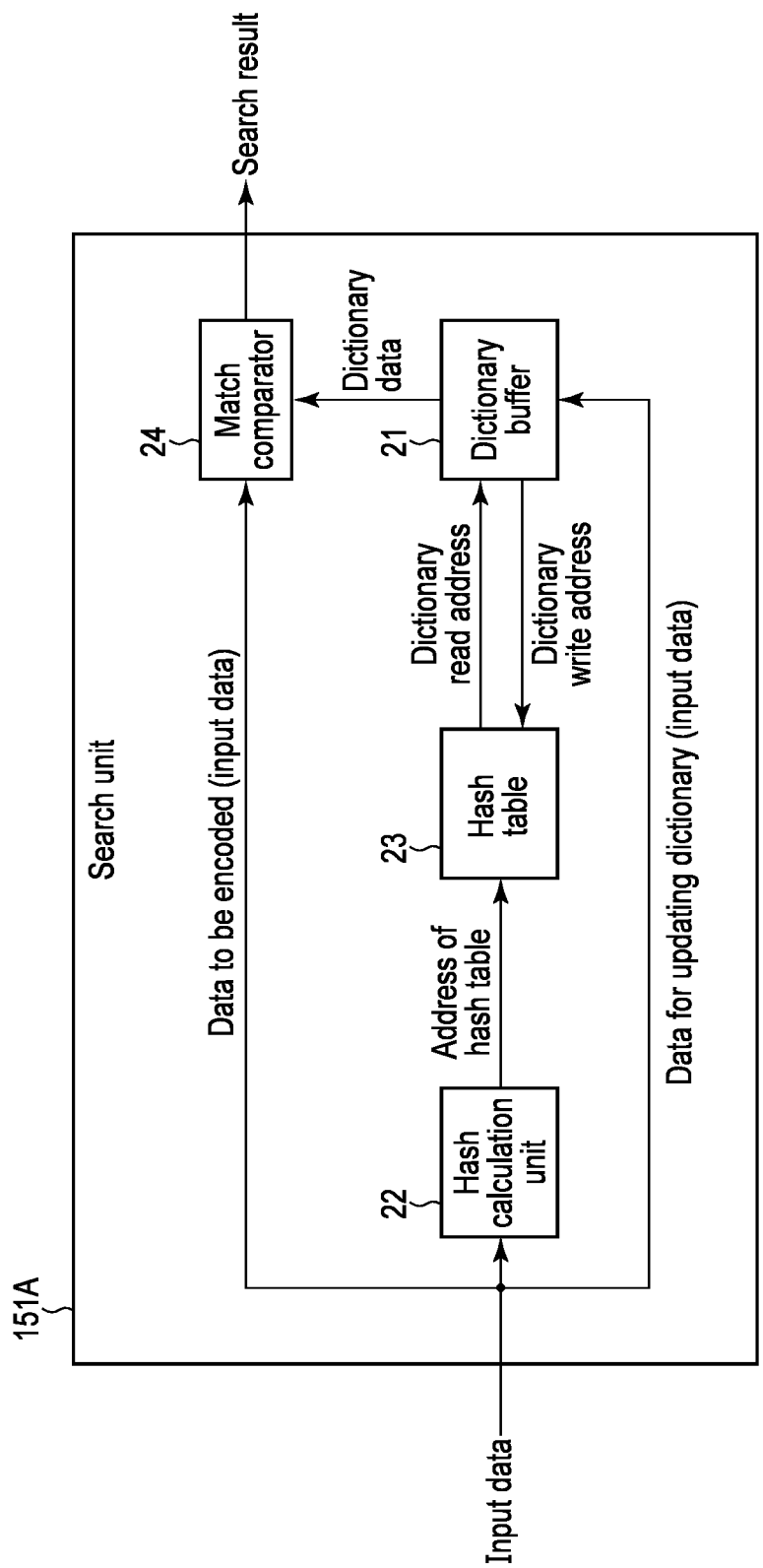
F I G. 3

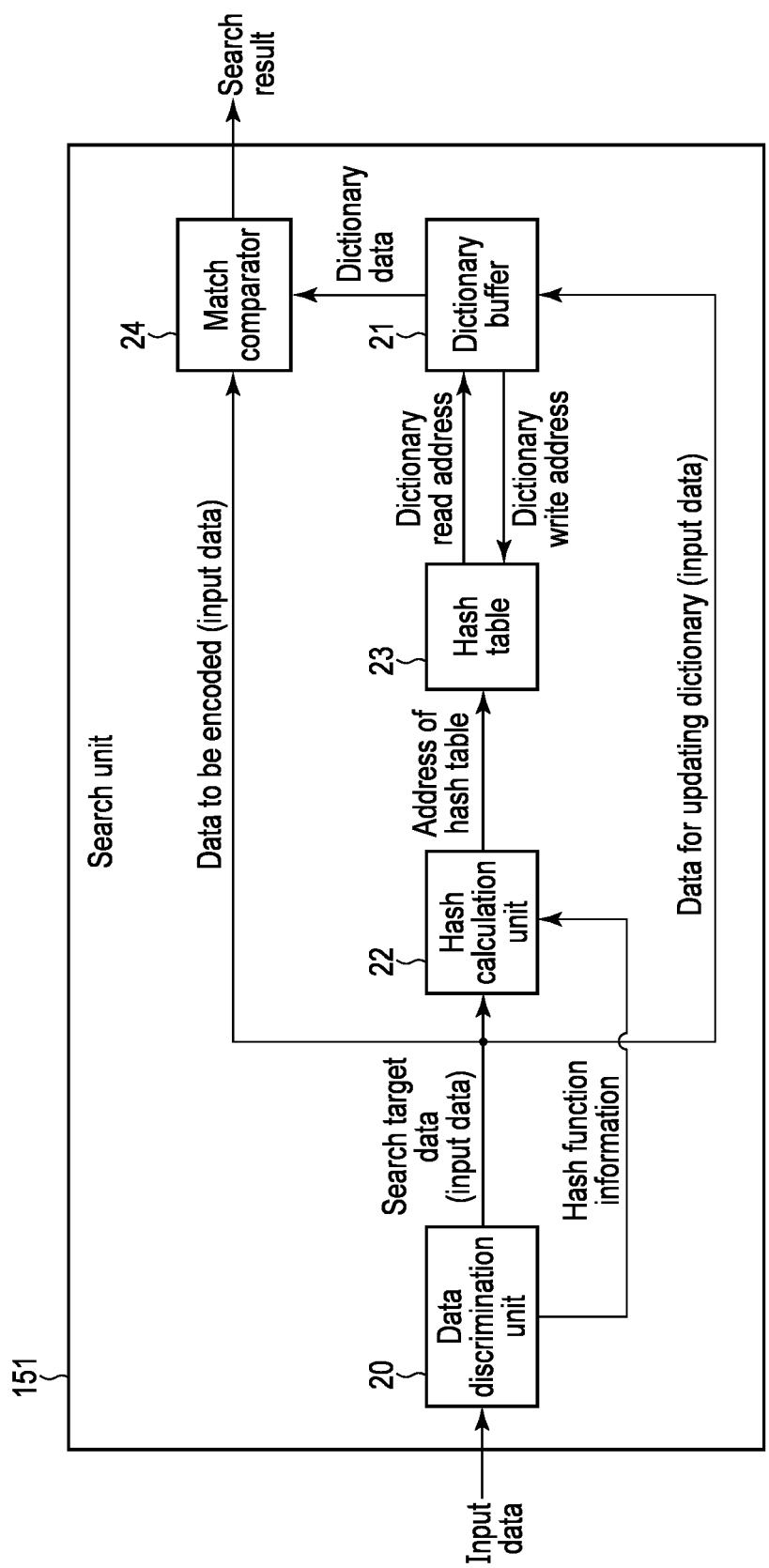
F I G. 12

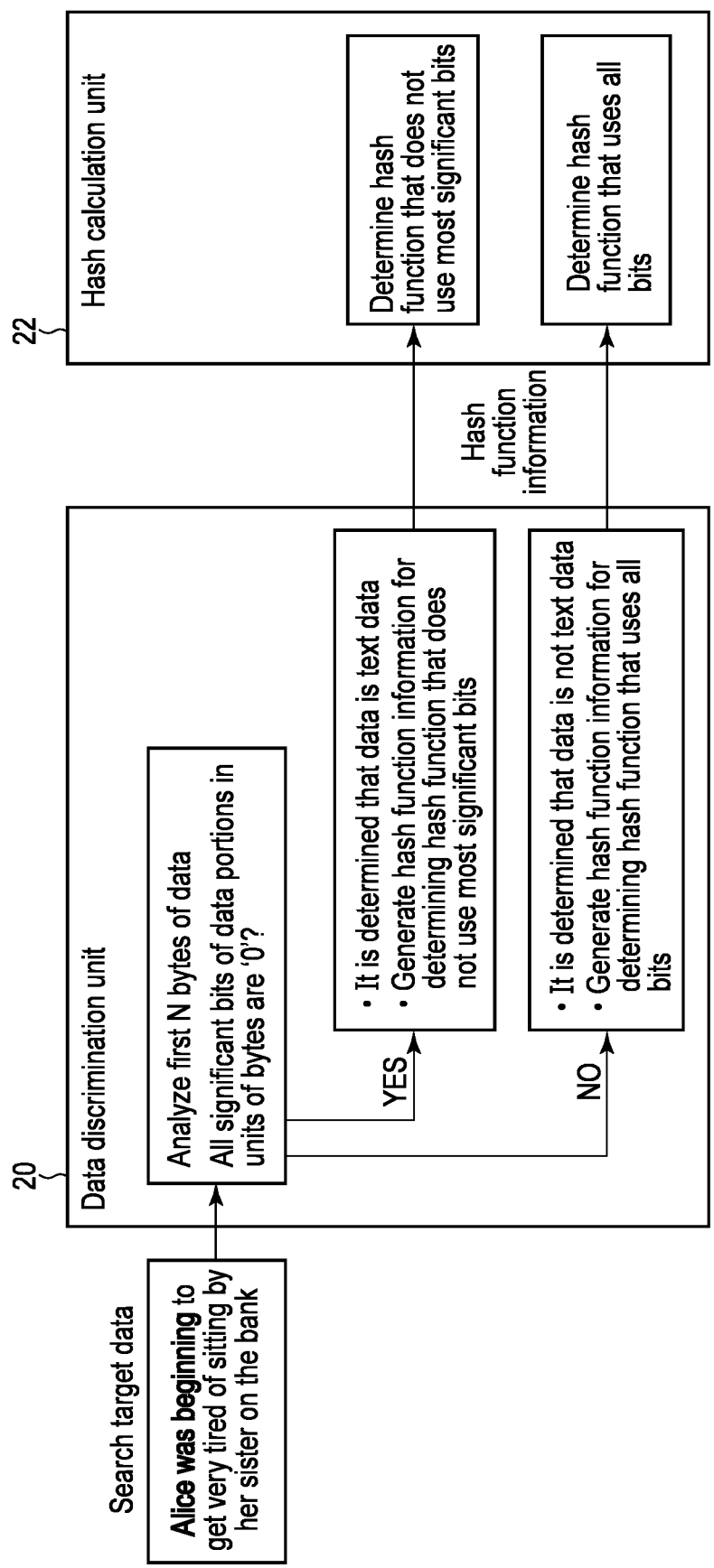
F I G. 13

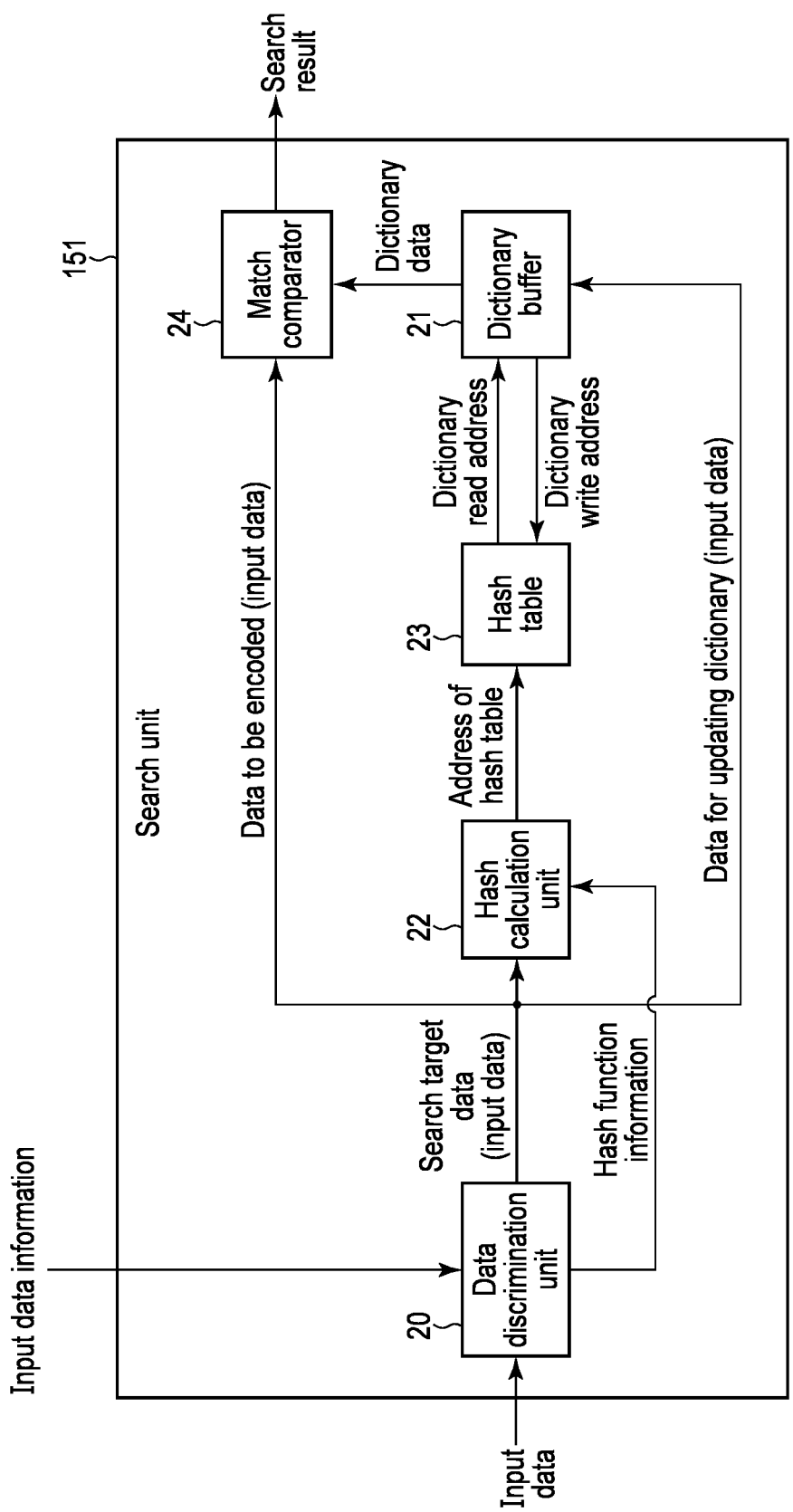
F I G. 16

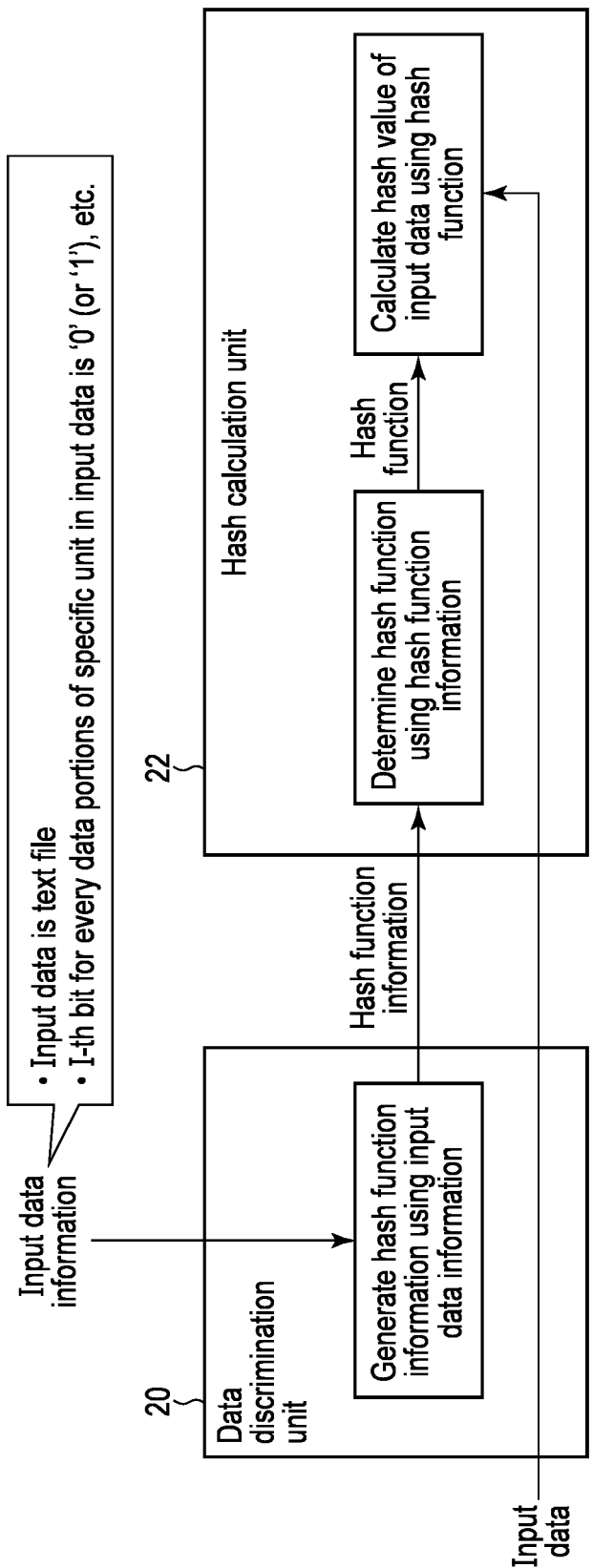
F I G. 17

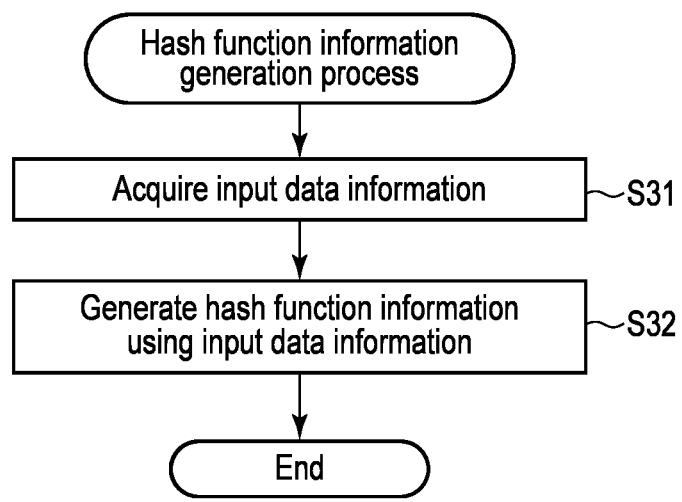
F I G. 18

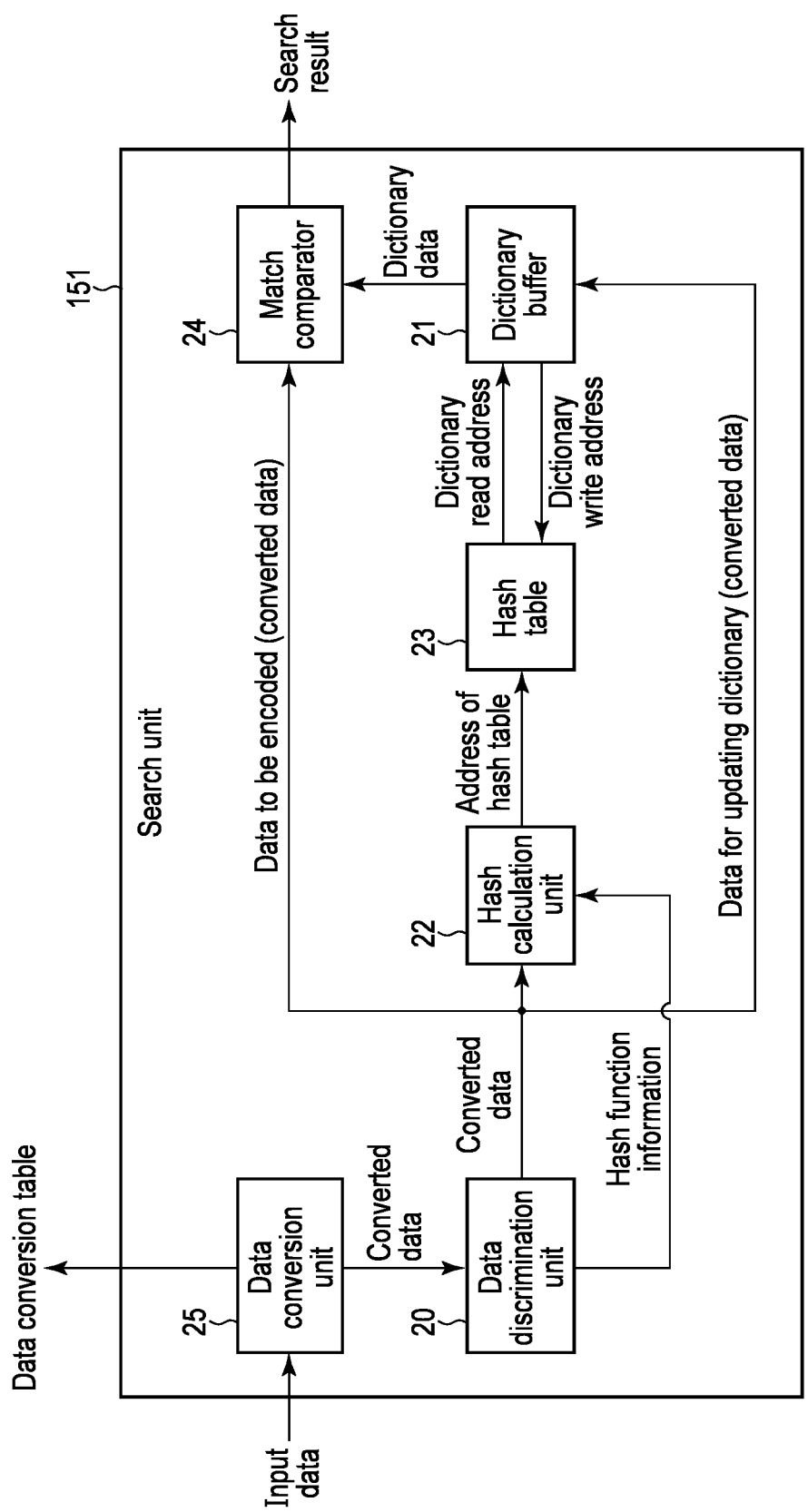
F I G. 19

| Index | Value |
|---|---|
| 0 | 10 |
| 1 | 20 |
| 2 | 44 |
| 3 | 38 |
| 4 | 80 |
| 5 | 90 |
| 6 | 2 |
| 7 | 5 |
| 8 | 100 |
| ⋮ | ⋮ |

Example in which only two patterns including 8'b1010_1010 and 8'b0101_0101 are input as input data

- Select hash function that does not use upper 7 bits
- Restore index number to data using data conversion table when decoding

COMPRESSION DEVICE AND CONTROL METHOD

CROSS-REFERENCE TO RELATED APPLICATIONS

This application is based upon and claims the benefit of priority from Japanese Patent Application No. 2020-206930, filed Dec. 14, 2020, the entire contents of which are incorporated herein by reference.

FIELD

Embodiments described herein relate generally to a compression device and a control method.

BACKGROUND

Storing a large amount of document data as it is in a storage such as a hard disk drive (HDD) and a solid state drive (SSD) bears on the capacity of the storage. This increases the cost for storing data in, for example, a data center.

In general, the amount of data stored in a storage is reduced with a method of lossless compressing data and storing the lossless compressed data in the storage. One of methods for lossless compression of data is a method in which dictionary encoding and entropy encoding are combined. In typical gzip dictionary encoding, a dictionary buffer that stores data (for example, a character string) input in the past is used. In the gzip dictionary encoding, the dictionary buffer is searched to acquire past data at least partially matching data to be compressed, and an address of the dictionary buffer and a match length are obtained. The address of the dictionary buffer is an address in the dictionary buffer at which the acquired past data is stored. The match length is the length of a matching portion between the acquired past data and the data to be compressed. The data to be compressed is converted into the address and the match length, thereby compressing the data.

A hash function is sometimes used in a method of searching a dictionary buffer to acquire past data at least partially matching compression target data. A hash collision occurring at the time of using the hash function is likely to reduce the accuracy of retrieving data from the dictionary buffer.

BRIEF DESCRIPTION OF THE DRAWINGS

FIG. 3 is a block diagram illustrating a configuration example of a search unit included in a compression device according to a comparative example.

FIG. 12 is a block diagram illustrating a configuration example of a search unit included in the compression device according to the first embodiment.

FIG. 13 is a view illustrating an operation example of a data discrimination unit and a hash calculation unit included in the search unit of FIG. 12.

FIG. 16 is a block diagram illustrating a configuration example of a search unit included in a compression device according to a second embodiment.

FIG. 17 is a view illustrating an operation example of a data discrimination unit and a hash calculation unit included in the search unit of FIG. 16.

FIG. 18 is a flowchart illustrating an example of the procedure of a hash function information generation process executed in the compression device according to the second embodiment.

FIG. 19 is a block diagram illustrating a configuration example of a search unit included in a compression device according to a third embodiment.

DETAILED DESCRIPTION

Various embodiments will be described hereinafter with reference to the accompanying drawings.

In general, according to one embodiment, a compression device includes a first storage unit, a second storage unit, a calculation unit, and a comparison unit. The first storage unit stores addresses that are associated with hash values, respectively. The second storage unit includes storage areas that are specified by the addresses, respectively, and store pieces of data, respectively. The calculation unit determines a first hash function to be used for first data in accordance with at least a part of the first data, and calculates a first hash value using the first hash function and at least a part of second data that is included in the first data. The comparison unit acquires third data from a storage area in the second storage unit that is specified by a first address, and compares the second data with the third data. The first address is stored in the first storage unit and is associated with the first hash value.

First Embodiment

Figure 1:
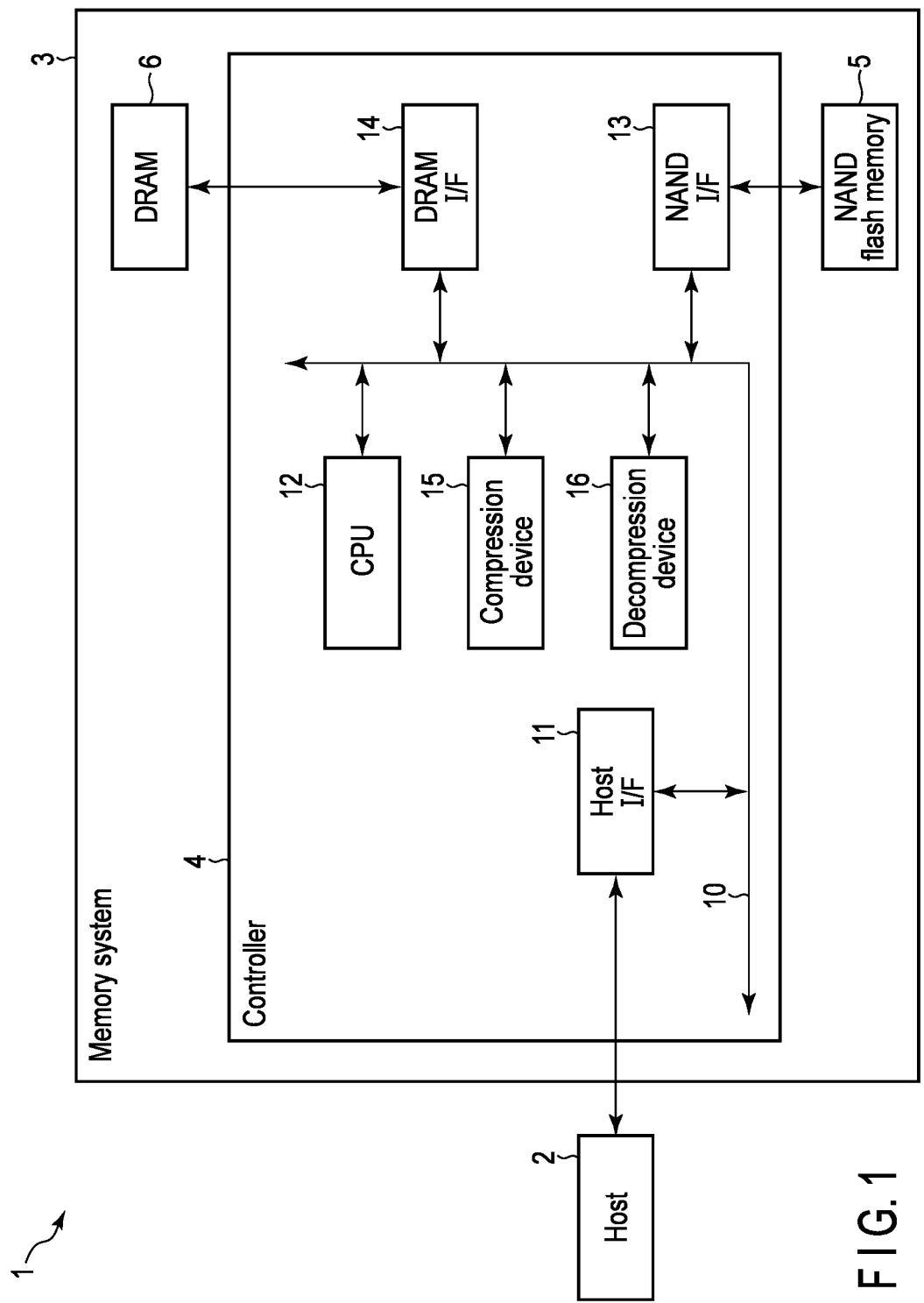
FIG. 1 is a block diagram illustrating a configuration example of a memory system including a compression device according to a first embodiment.

FIG. 1 illustrates a configuration example of an information processing system 1 including a memory system 3 according to a first embodiment. The information processing system 1 includes a host device 2 (hereinafter, referred to as a host 2) and the memory system 3.

The memory system 3 is a semiconductor storage device configured to write data to a nonvolatile memory, such as a NAND flash memory 5, and read data from the nonvolatile memory. The memory system 3 is realized as, for example, a solid state drive (SSD) including the NAND flash memory 5. Hereinafter, a case where the memory system 3 is realized as an SSD will be exemplified, but the memory system 3 may be realized as a hard disk drive (HDD).

The host 2 may be a storage server that stores a large amount of various data in the memory system 3, or may be a personal computer.

The memory system 3 may be used as a storage of the host 2. The memory system 3 may be built in the host 2 or may be connected to the host 2 via a cable or a network.

An interface configured to connect the host 2 and the memory system 3 conforms to SCSI, Serial Attached SCSI (SAS), AT Attachment (ATA), Serial ATA (SATA), PCI Express (PCIe) (registered trademark), Ethernet (registered trademark), Fibre channel, NVM Express (NVMe) (registered trademark), or the like.

The memory system 3 includes a controller 4 and the NAND flash memory 5. The controller 4 may be realized by a circuit such as a system-on-a-chip (SoC).

The controller 4 may include a random access memory (RAM) which is a volatile memory, for example, a dynamic random access memory (DRAM) 6. Alternatively, a RAM, such as a static random access memory (SRAM), may be built in the controller 4. Note that the DRAM 6 may be built in the controller 4.

In the RAM such as the DRAM 6, a storage area for firmware (FW) loaded from the NAND flash memory 5 is provided, for example.

The NAND flash memory 5 includes multiple blocks. Each of the blocks includes multiple pages. A block functions as a minimum erase unit. A block is also be referred to as an erase block or a physical block. Each of the pages includes memory cells connected to a single word line. A page functions as a unit of a data write operation and a data read operation. Note that a word line may function as a unit of a data write operation and a data read operation.

The tolerable maximum number of program/erase cycles (maximum number of P/E cycles) for each of the blocks is limited. One P/E cycle of a block includes a data erase operation to erase data stored in all memory cells in the block and a data write operation to write data in each page of the block.

The controller 4 may include a host interface (host I/F) 11, a CPU 12, a NAND interface (NAND I/F) 13, a DRAM interface (DRAM I/F) 14, and a compression device 15. The host I/F 11, the CPU 12, the NAND I/F 13, the DRAM I/F 14, and the compression device 15 may be interconnected via a bus 10.

The controller 4 is electrically connected to the NAND flash memory 5 via the NAND I/F 13 that conforms to an interface standard such as Toggle DDR and Open NAND Flash Interface (ONFI). The NAND I/F 13 functions as a NAND control circuit configured to control the NAND flash memory 5.

The controller 4 functions as a memory controller configured to control the NAND flash memory 5.

The controller 4 may function as a flash translation layer (FTL) configured to execute data management and block management of the NAND flash memory 5. The data management executed by the FTL includes (1) management of mapping data indicative of relationship between each logical address and each physical address of the NAND flash memory 5, and (2) process to hide a difference between read/write operations executed in units of page and erase operations executed in units of block. The logical address is an address used by the host 2 for addressing the memory system 3.

Management of mapping between each logical address and each physical address is executed by using a logical-to-physical address conversion table. The controller 4 manages mapping between each logical address and each physical address with a certain management size by using the logical-to-physical address conversion table. A physical address corresponding to a logical address indicates a physical memory location in the NAND flash memory 5 to which data of the logical address is written. The logical-to-physical address conversion table may be loaded to the DRAM 6 from the NAND flash memory 5 when the memory system 3 is powered on.

Data write into one page is executable only once in a single P/E cycle. Thus, the controller 4 writes updated data corresponding to a logical address not to an original physical memory location in which previous data corresponding to the logical address is stored but to a different physical memory location. Then, the controller 4 updates the logical-to-physical address conversion table to associate the logical address with the different physical memory location and to invalidate the previous data.

The block management includes management of defective blocks, wear leveling, and garbage collection.

The host I/F 11 is a hardware interface to perform communication between the memory system 3 and the host 2 that is an external device of the memory system 3. The host I/F 11 functions as a circuit that receives various commands, for example, I/O commands and various control commands from the host 2. The I/O commands may include a write command and a read command. The control commands may include an unmap command (trim command) and a format command. The host I/F 11 also functions as a circuit that transmits to the host 2 a response or data in accordance with a command.

The DRAM I/F 14 functions as a DRAM control circuit configured to control accessing the DRAM 6. The storage area of the DRAM 6 is allocated to an area for storing the FW and a buffer area used as a read/write buffer or the like.

The CPU 12 is a processor configured to control the host I/F 11, the NAND I/F 13, and the DRAM I/F 14. The CPU 12 performs various processes by executing the FW loaded in the DRAM 6. That is, the FW is control programs for controlling the operation of the CPU 12. In addition to the above-described FTL processing, the CPU 12 may execute command processing for processing various commands from the host 2 or the like. Note that a part or all of the FTL processing and the command processing may be executed by a dedicated hardware in the controller 4.

The compression device 15 encodes data to be written into the NAND flash memory 5, thereby compressing the data. The compression device 15 encodes, for example, plain text data that is received in accordance with reception of a write command from the host 2. In order to compress the data, the compression device 15 has, for example, a configuration for realizing a method in which dictionary encoding and entropy encoding are combined.

Figure 2:
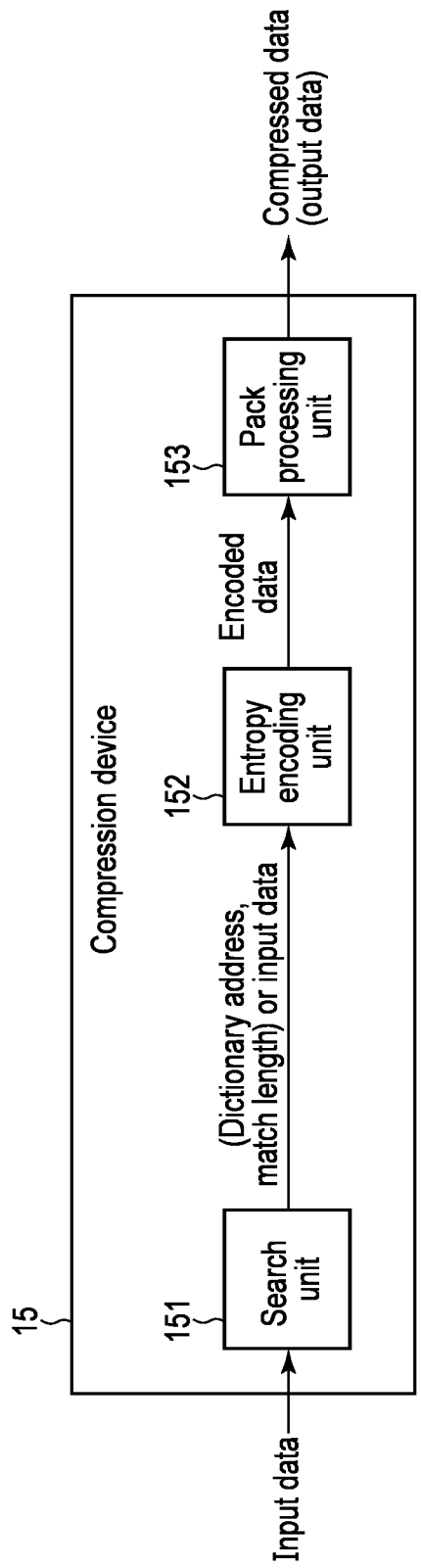
FIG. 2 is a block diagram illustrating a configuration example of the compression device according to the first embodiment.

FIG. 2 illustrates a configuration example of the compression device 15. The compression device 15 includes, for example, a search unit 151, an entropy encoding unit 152, and a pack processing unit 153.

The search unit 151 performs dictionary encoding on input data. The input data is data to be compressed. In the dictionary encoding, a buffer that stores data input in the past (hereinafter, referred to as a dictionary buffer) is used. In the dictionary encoding, the dictionary buffer is searched to acquire past data at least partially matching the input data, and a combination of an address of the dictionary buffer and a match length of the data is obtained. The address of the dictionary buffer is an address at which the acquired past data is stored in the dictionary buffer. The match length of the data is the length of a matching portion between the acquired past data and the input data. The search unit 151 can compress the input data by converting the input data into the combination of the address of the dictionary buffer and the match length of the data.

When the past data at least partially matching the input data is present in the dictionary buffer, the search unit 151 outputs the combination of the address of the dictionary buffer and the match length of the data to the entropy encoding unit 152. When past data at least partially matching the input data is not present in the dictionary buffer, the search unit 151 outputs the input data to the entropy encoding unit 152.

The entropy encoding unit 152 performs entropy encoding on the combination of the address of the dictionary buffer and the match length of the data output from the search unit 151. The entropy encoding unit 152 performs entropy encoding on the input data output from the search unit 151. The entropy encoding may be static entropy encoding or dynamic (adaptive) entropy encoding.

In the static entropy encoding, all symbols to be encoded are input and accumulated (buffered), and a frequency table indicating an appearance frequency of each symbol is acquired. Further, an encoding table is generated such that a code having a shorter code length is allocated to a symbol having a higher appearance frequency. As the accumulated symbols are converted into code words using this encoding table, highly efficient encoding can be realized.

In the adaptive entropy encoding, the frequency table and the encoding table are dynamically updated while symbols to be encoded are input. The adaptive entropy encoding has a lower latency than the static entropy encoding.

The entropy encoding unit 152 outputs data obtained by the entropy encoding (hereinafter, referred to as encoded data) to the pack processing unit 153.

The pack processing unit 153 may collectively output one or more items of encoded data, which are output from the entropy encoding unit 152, as compressed data (compressed stream) for each specific data size.

Part or all of the search unit 151, the entropy encoding unit 152, and the pack processing unit 153 may be implemented as hardware such as a circuit, or may be implemented as programs (that is, software) executed by at least one processor.

Note that the controller 4 may include a decompression device 16. The decompression device 16 decodes compressed data that is read from the NAND flash memory 5, thereby decompressing the compressed data. For example, when the controller 4 receives a read command from the host 2, the decompression device 16 decodes compressed data read from the NAND flash memory 5. The CPU 12 transmits the decoded data to the host 2 as a response to the read command from the host 2. The decompression device 16 has a configuration for decompression (that is, inverse conversion) of compressed data according to the configuration for compression by the compression device 15.

The controller 4 may further include an ECC encoder and an ECC decoder. In this case, the ECC encoder generates an error correction parity (ECC parity) for compressed data output from the pack processing unit 153, and generates a code word having the generated ECC parity and the compressed data. The CPU 12 is configured to write the code word to the NAND flash memory 5 via the NAND I/F 13. In this case, when the controller 4 reads data from the NAND flash memory 5 on the basis of, for example, a read command issued from the host 2, the CPU 12 reads a code word from the NAND flash memory 5 via the NAND I/F 13, and the ECC decoder performs an error detection process and an error correction process on the read code word to generate compressed data. The decompression device 16 is configured to decompress the generated compressed data. That is, the controller 4 may be configured to write data based on the compressed data, which is output from the pack processing unit 153, to the NAND flash memory 5, and generate compressed data based on data read from the NAND flash memory 5 and decompress the generated compressed data.

Here, a method in which the search unit 151 searches the dictionary buffer to acquire past data at least partially matching input data will be specifically described. Hereinafter, a case where the input data is a character string will be mainly exemplified in order to facilitate understanding of the description. The input data as the character string is also referred to as an input character string. Note that the input data may be various types of data that are not limited to the character string.

The simplest method of searching a dictionary buffer to acquire a past character string at least partially matching an input character string is full search. In the full search, the input character string is compared with each of all character strings stored in the dictionary buffer, and the longest matching character string is obtained from the dictionary buffer.

In the full search, however, the calculation cost for the comparison is great since the input character string is compared with each of all the character strings stored in the dictionary buffer. Therefore, the full search is not generally adopted as the method of searching the dictionary buffer to acquire the past character string at least partially matching the input character string, except for a case where the search accuracy is enhanced without considering the calculation cost.

Another method of searching a dictionary buffer to acquire a past character string at least partially matching an input character string is search using a hash. In the search using a hash, a hash function is used. The hash function is a function that converts a value into another value. The hash function used in the dictionary encoding is, for example, a function that converts a character string having N characters (N bytes) into a value of M bytes. That is, the value of M bytes obtained by the conversion is a hash value of the character string having N characters. Note that M is smaller than N. Therefore, $2^N$ kinds of character strings are converted into $2^M$ kinds of values, which are fewer, by the conversion using the hash function. Therefore, two different character strings are sometimes converted into the same hash value in the conversion using the hash function. The conversion of two different character strings to the same hash value is referred to as a hash collision.

The hash collision will be described using a compression device according to a comparative example.

FIG. 3 illustrates a configuration example of a search unit included in the compression device according to the comparative example. A search unit 151A of the compression device according to the comparative example is an example of a configuration that realizes search using a hash. The search unit 151A includes a dictionary buffer 21, a hash calculation unit 22, a hash table 23, and a match comparator 24. Data input to the search unit 151A is input to, for example, the dictionary buffer 21, the hash calculation unit 22, and the match comparator 24.

The dictionary buffer 21 includes multiple storage areas. Each of the storage areas stores past input data (for example, character string). Data stored in each of the storage areas is also referred to as dictionary data. The storage areas are specified by addresses, respectively. That is, each of the addresses indicates a memory location in the dictionary buffer 21. Note that each of the addresses is also referred to as a dictionary address.

The hash calculation unit 22 calculates a hash value of at least a part of current input data using a hash function. The hash calculation unit 22 uses a predetermined hash function to calculate the hash value. The hash calculation unit 22 outputs the calculated hash value to the hash table 23. Note that a hash value of at least a part of input data is also simply referred to as a hash value of the input data hereinafter.

The hash table 23 may store pieces of data that are associated with hash values, respectively. More specifically, the hash table 23 includes storage areas. Each of the hash values functions as an address for specifying any one of the storage areas in the hash table 23. A storage area specified using a hash value may store data associated with the hash value. The data associated with the hash value is, for example, an address that indicates a storage area in the dictionary buffer 21 in which past input data is stored (that is, dictionary address).

The hash table 23 specifies one of the storage areas in the hash table 23 using a hash value of current input data, which is output by the hash calculation unit 22, as an address.

When a dictionary address is stored in the specified storage area, the hash table 23 outputs the dictionary address to the dictionary buffer 21. The dictionary address output from the hash table 23 to the dictionary buffer 21 is also referred to as a dictionary read address.

The dictionary buffer 21 specifies one of the storage areas in the dictionary buffer 21 using the dictionary read address output by the hash table 23. Then, the dictionary buffer 21 outputs dictionary data stored in the specified storage area to the match comparator 24. The dictionary data is data acquired from the storage area in the dictionary buffer 21 specified by the dictionary read address that is stored in the hash table 23 and is associated with the hash value of the input data.

The match comparator 24 receives the input data and the dictionary data output by the dictionary buffer 21. Then, the match comparator 24 compares the input data with the dictionary data, and outputs a search result (comparison result) to the entropy encoding unit 152. The search result includes a combination of the dictionary address from which the dictionary data is acquired and a match length. The match length indicates the length of a portion of the input data that continuously matches the dictionary data from the start. Note that when there is no matching portion between the input data and the dictionary data, the match comparator 24 outputs the input data as it is to the entropy encoding unit 152.

In addition, when the dictionary data is not output by the dictionary buffer 21 (for example, when the dictionary address associated with the hash value of the input data is not stored in the hash table 23), the match comparator 24 outputs the input data as it is as the search result.

After the search result is output by the match comparator 24, the dictionary buffer 21 stores the current input data, which is input to the search unit 151A, in one of the storage areas in the dictionary buffer 21. Then, the dictionary buffer 21 outputs a dictionary address that specifies the storage area in which the input data has been stored, to the hash table 23. The dictionary address output from the dictionary buffer 21 to the hash table 23 is also referred to as a dictionary write address.

The hash table 23 stores the dictionary write address, which is output by the dictionary buffer 21, in the storage area specified using the hash value of the input data. As the dictionary write address is stored in the storage area specified using the hash value of the input data, the dictionary address in which the input data is stored is associated with the hash value of the input data, in the hash table 23.

Here, the search using a hash will be described using an operation of each part in the search unit 151A. The search using a hash includes, for example, three stages of (1) registration of a character string in a dictionary, (2) acquisition of dictionary data, and (3) match evaluation of character strings. The search unit 151A operates in each stage as follows.

(1) Registration of Character String in Dictionary

The dictionary buffer 21 stores an input character string. The hash calculation unit 22 calculates a hash value of the first N characters of the input character string using the hash function. The hash table 23 stores an address of the dictionary buffer 21 in which the input character string has been stored (dictionary write address), in a storage area in the hash table 23 that is specified using the calculated hash value as an address.

(2) Acquisition of Dictionary Data

The hash table 23 specifies a storage area in the hash table 23 using a hash value of the first N characters of an input character string as an address. The hash table 23 outputs a dictionary address stored in the specified storage area (dictionary read address) to the dictionary buffer 21. The dictionary buffer 21 specifies a storage area in the dictionary buffer 21 using the dictionary read address output by the hash table 23. The dictionary buffer 21 outputs a character string stored in the specified storage area (dictionary character string) to the match comparator 24.

(3) Match Evaluation of Character Strings

The match comparator 24 compares the input character string with the dictionary character string. When there is a matching portion between the input character string and the dictionary character string, the match comparator 24 outputs the dictionary read address and the match length. When there is no matching portion between the input character string and the dictionary character string, the match comparator 24 outputs the input character string.

A specific example of the search using a hash will be further described with reference to FIGS. 4 to 6.

Figure 4:
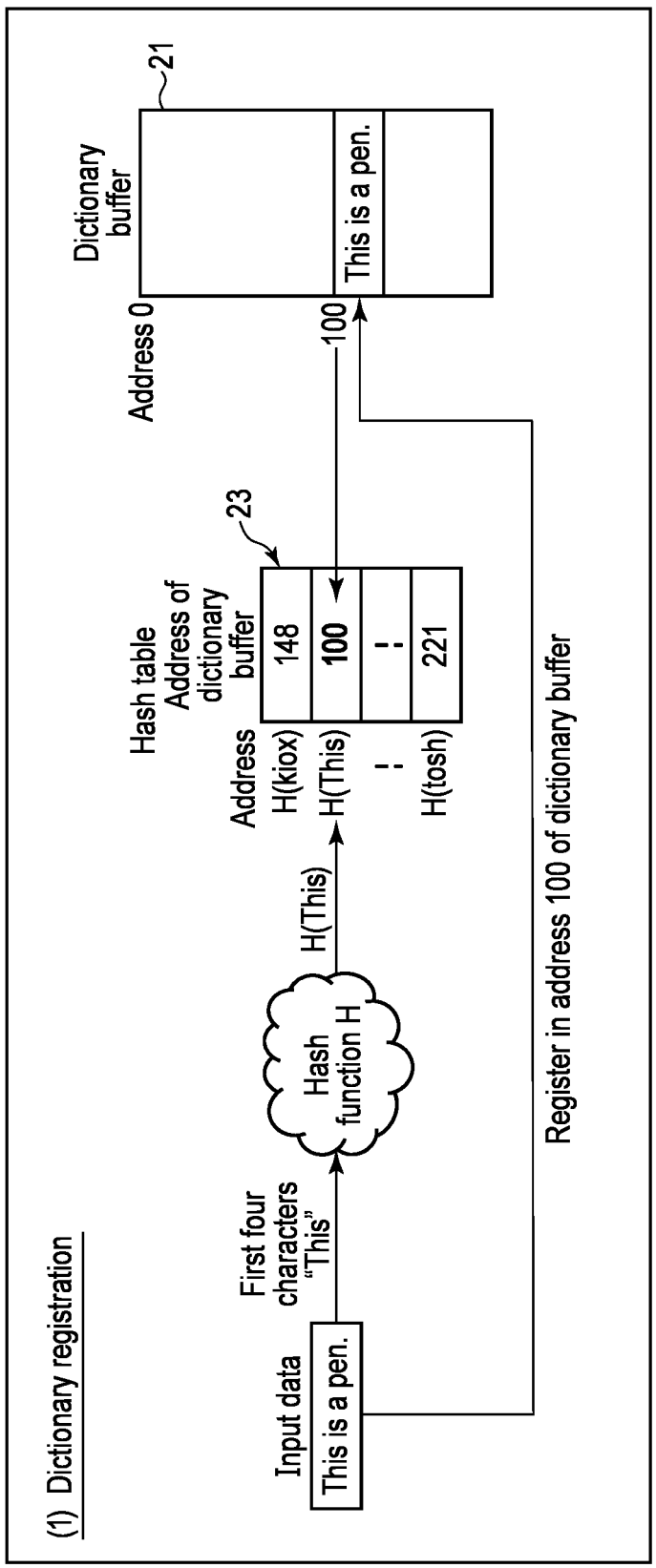
FIG. 4 is a view illustrating an example in which input data is registered using a hash table and a dictionary buffer.

FIG. 4 illustrates an example in which input data is registered using the hash table 23 and the dictionary buffer 21. The example illustrated in FIG. 4 corresponds to the stage of (1) Registration of character string in dictionary in the above-described search method using a hash. Here, "This is a pen." is input as input data to the search unit 151A.

The dictionary buffer 21 stores the input data "This is a pen.". In the dictionary buffer 21, a storage area in which the input data is stored is, for example, a storage area subsequent to a storage area in which previously input data has been stored. The storage areas in the dictionary buffer 21 are used to store input data in order from a storage area having a smaller address, for example. Here, the input data is stored in the storage area with an address 100 in the dictionary buffer 21. The dictionary buffer 21 outputs the address 100 to the hash table 23.

The hash calculation unit 22 calculates a hash value H(This) of "This", which is first four characters (that is, four bytes) of the input data, using a hash function H. The hash calculation unit 22 outputs the hash value H(This) to the hash table 23. Note that, here, it is assumed that no data (that is, dictionary address) is stored in a storage area in the hash table 23 specified by the hash value H(This) before the current input data is input.

The hash table 23 stores the dictionary address 100, which is output from the dictionary buffer 21, in the storage area in the hash table 23 specified by the hash value H(This). That is, the dictionary address 100 is stored in the storage area with an address H(This) in the hash table 23. As a result, in the hash table 23, the dictionary address 100 in which the input data is stored is associated with the hash value H(This) of the input data.

Figure 5:
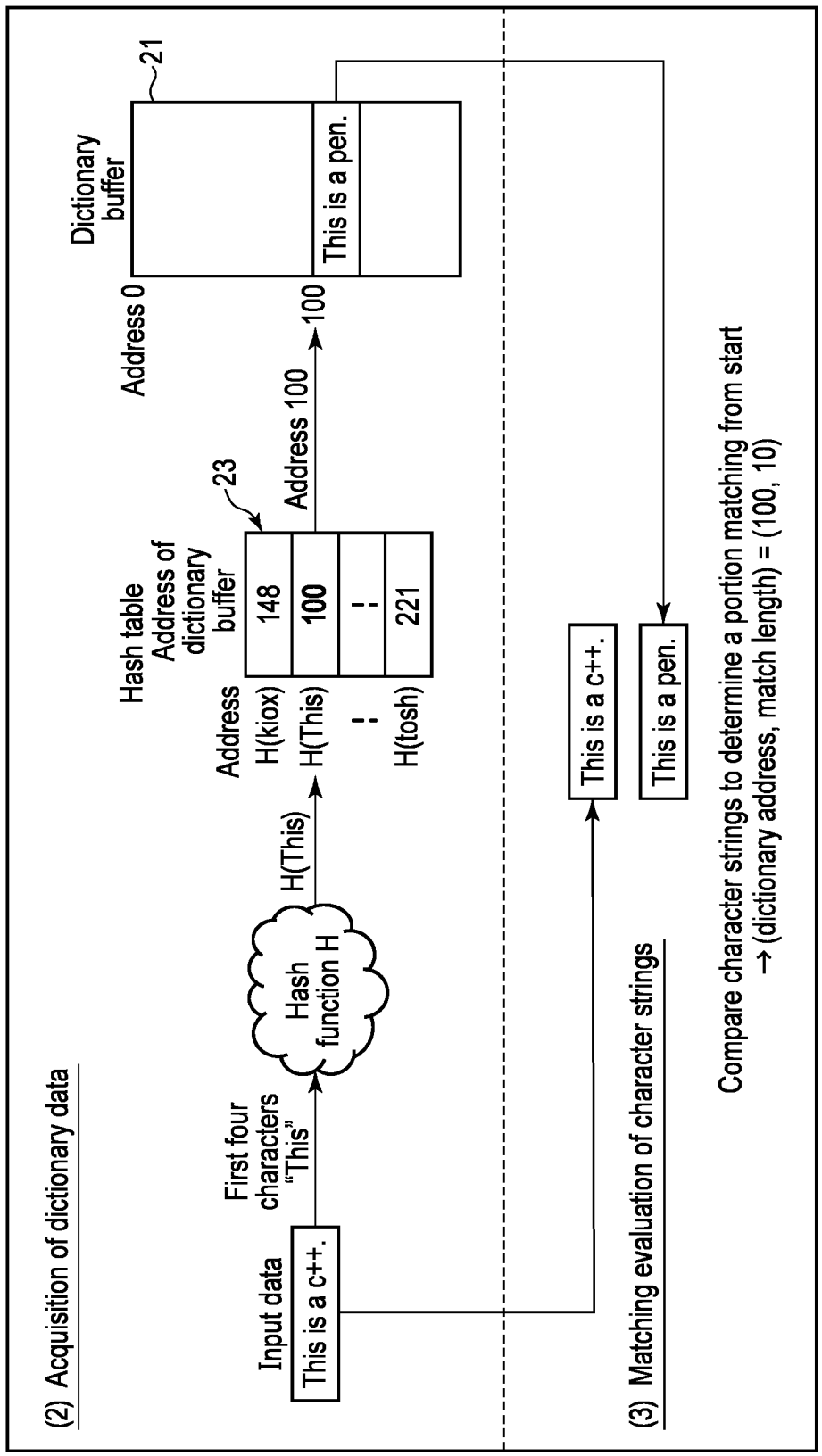
FIG. 5 is a view illustrating an example in which new input data is compared with data in the dictionary buffer using the hash table of FIG. 4.

FIG. 5 illustrates an example in which new input data is compared with data in the dictionary buffer 21 using the hash table 23 illustrated in FIG. 4. The example illustrated in FIG. 5 corresponds to the stages of (2) Acquisition of dictionary data and (3) Matching evaluation of character strings in the above-described search method using a hash. Here, "This is a c++." is input as input data to the search unit 151A.

The hash calculation unit 22 calculates a hash value H(This) of "This", which is first four characters of the input data, using the hash function H. The hash calculation unit 22 outputs the hash value H(This) to the hash table 23.

The hash table 23 outputs the dictionary address 100 associated with the hash value H(This) to the dictionary buffer 21. That is, the hash table 23 outputs the dictionary address 100 stored in the storage area with the address H(This) to the dictionary buffer 21.

The dictionary buffer 21 outputs data (dictionary data) "This is a pen." stored in the dictionary address 100 to the match comparator 24.

The match comparator 24 compares the input data "This is a c++." with the dictionary data "This is a pen." to obtain the match length. The match length is, for example, the length of a portion "This is a" of the input data that continuously matches the dictionary data from the start (here, match length is 10). Note that the match length also includes a space. The match comparator 24 outputs, for example, (100, 10) indicating a combination of the dictionary address and the match length as a search result.

Figure 6:
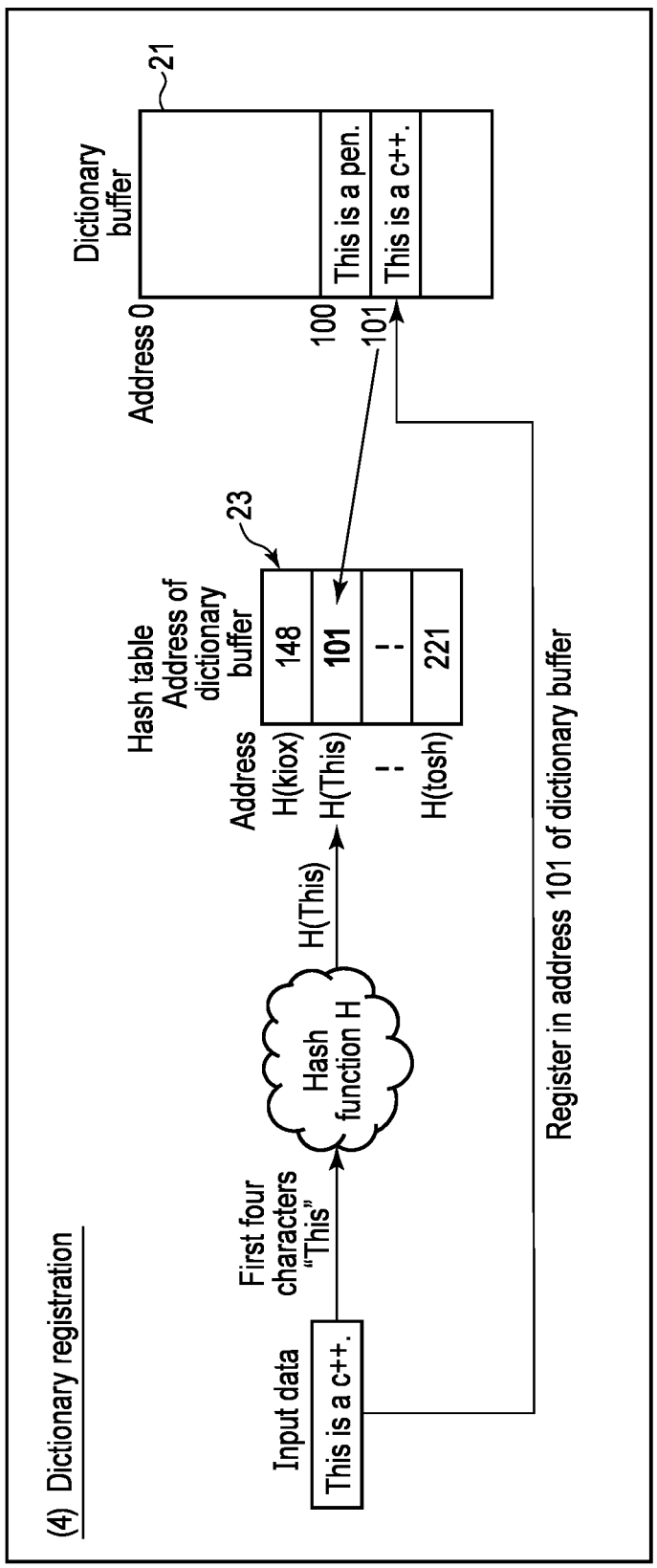
FIG. 6 is a view illustrating an example in which new input data is registered in the dictionary buffer using the hash table and the dictionary buffer of FIG. 4.

FIG. 6 illustrates an example in which the input data "This is a c++." is registered using the hash table 23 and the dictionary buffer 21 illustrated in FIG. 4.

Specifically, the dictionary buffer 21 stores the input data "This is a c++.". Here, the input data is stored in a storage area with a dictionary address 101. The dictionary buffer 21 outputs the dictionary address 101 to the hash table 23.

The hash table 23 stores the dictionary address 101, which is output from the dictionary buffer 21, in the storage area in the hash table 23 specified by the hash value H(This). That is, the dictionary address 101 is stored (overwritten) in the storage area with the address H(This) in the hash table 23. As a result, in the hash table 23, the dictionary address 101 in which the input data is stored is associated with the hash value H(This) of the input data. That is, the hash table 23 is updated such that the hash value H(This) is associated with not the dictionary address 100 in which the past input data "This is a pen." is stored but the dictionary address 101 in which the current input data "This is a c++." is stored.

As described above with reference to FIG. 5, it is sufficient for the search unit 151A to acquire dictionary data from the dictionary buffer 21 using the hash value and compare only the acquired dictionary data with the input data in the search method using the hash. Therefore, the search cost of the search method using the hash is less than the search cost of the full search.

However, in the case of using the hash value, data that is supposedly stored in the dictionary buffer 21 is not retrieved due to a hash collision in some cases. An example of a case where a hash collision occurs will be described with reference to FIGS. 7 to 9.

Figure 7:
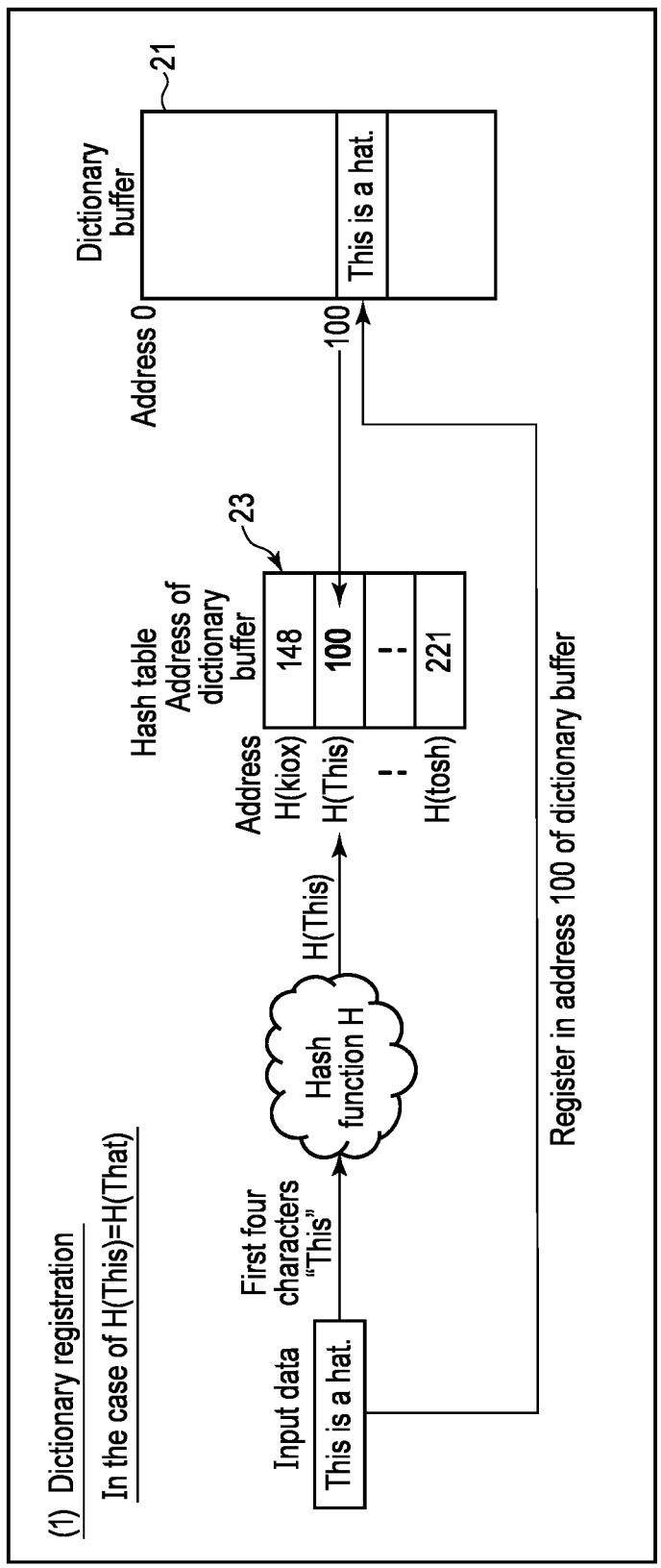
FIG. 7 is a view illustrating another example in which input data is registered using the hash table and the dictionary buffer.

FIG. 7 illustrates another example in which input data is registered using the hash table 23 and the dictionary buffer 21. In the example illustrated in FIG. 7, "This is a hat." is input as input data to the search unit 151A.

In the example illustrated in FIG. 7, the input data "This is a hat." is registered in the dictionary similarly to the example described above with reference to FIG. 4. That is, the dictionary buffer 21 stores the input data in the dictionary address 100. Then, the hash table 23 stores the dictionary address 100 in association with the hash value H(This) of the first four characters of the input data.

Here, it is assumed that the hash function H used to calculate a hash value is a hash function of H(This)=H (That). That is, the hash function H is a function in which a hash collision occurs between input data starting with "This" and input data starting with "That".

Figure 8:
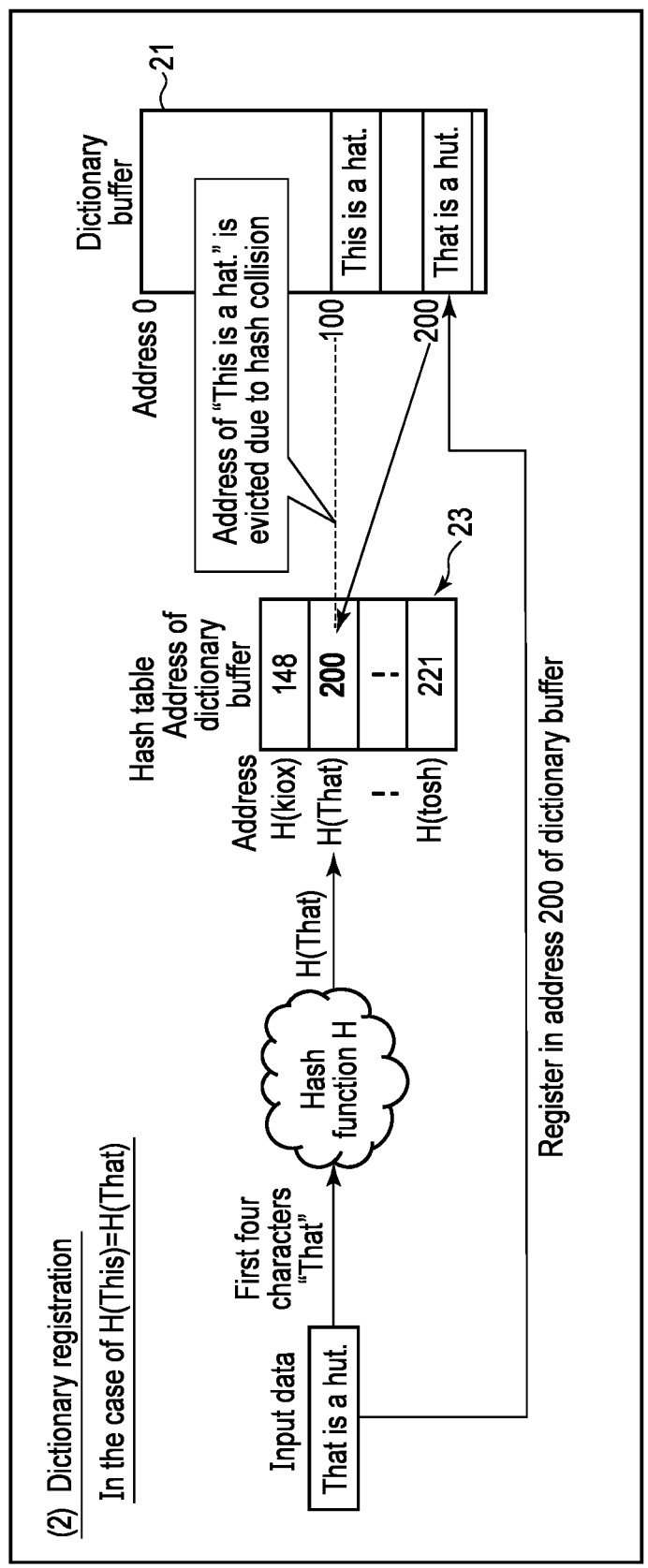
FIG. 8 is a view illustrating an example in which a dictionary address indicating a memory location of the input data in FIG. 7 is evicted from a hash table due to a hash collision.

FIG. 8 illustrates an example in which new input data is registered after registration of the input data "This is a hat." in the dictionary illustrated in FIG. 7. In the example illustrated in FIG. 8, "That is a hut." is input as the new input data to the search unit 151A.

The dictionary buffer 21 stores the input data "That is a hut.". Here, the input data is stored in a storage area with a dictionary address 200. The dictionary buffer 21 outputs the dictionary address 200 to the hash table 23.

The hash calculation unit 22 calculates a hash value H(That) of the input data using the hash function H. The hash calculation unit 22 outputs the hash value H(That) to the hash table 23.

The hash table 23 stores (overwrites) the dictionary address 200, which is output from the dictionary buffer 21, in a storage area in the hash table 23 specified by the hash value H(That). That is, the dictionary address 200 is stored in the storage area with the address H(That) in the hash table 23. As a result, the dictionary address 200 in which the input data is stored is associated with the hash value H(That) of the input data in the hash table 23.

In this manner, the dictionary address 100 of the past input data "This is a hat." is evicted from the hash table 23 due to the hash collision of H(This)=H(That). This means that the data "This is a hat." stored in the address 100 of the dictionary buffer 21 is not accessed even if H(This) is calculated as a hash value of a subsequent input data. Therefore, the past input data "This is a hat." is not used for comparison with new input data in spite of being stored in the address 100 of the dictionary buffer 21.

Figure 9:
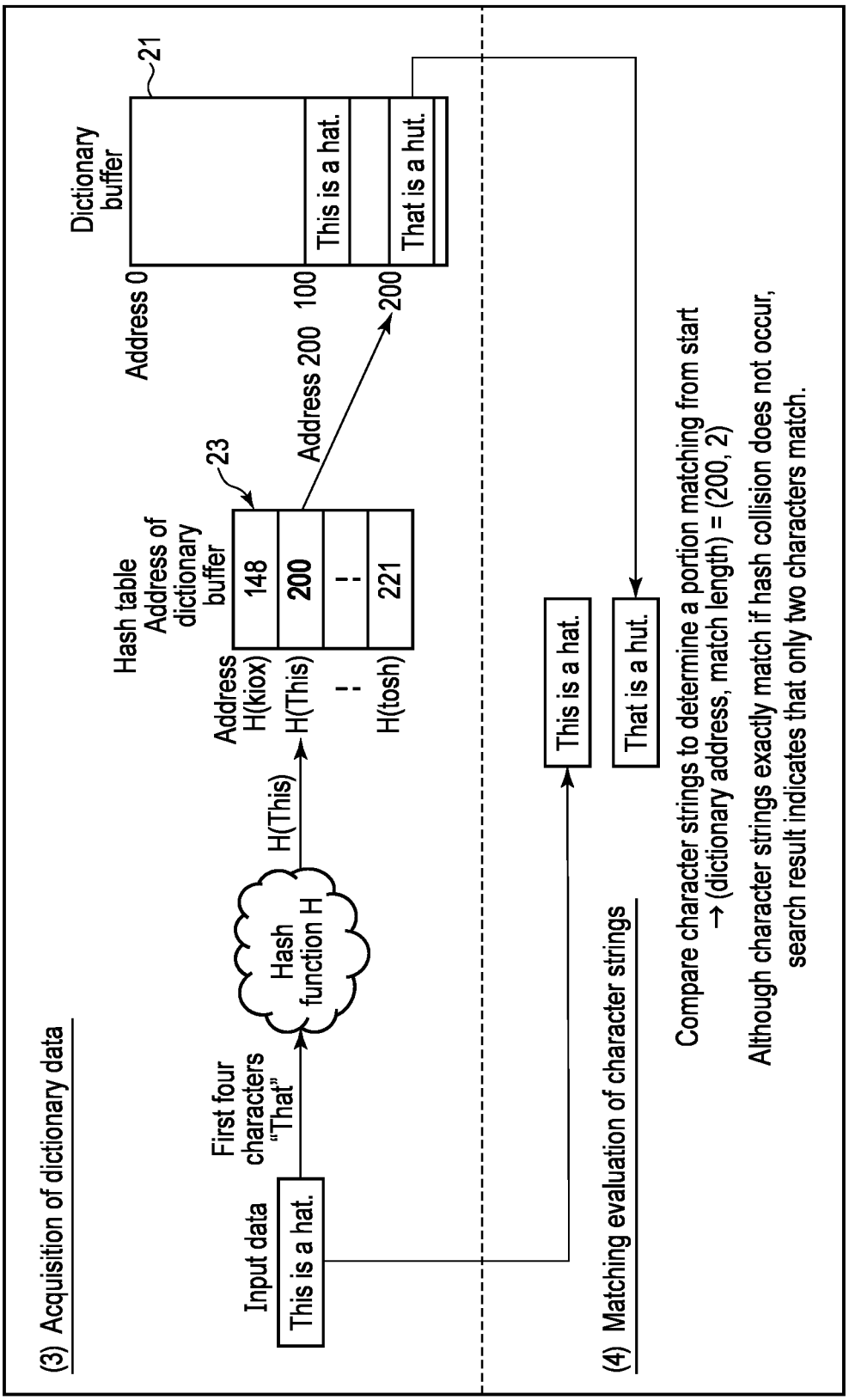
FIG. 9 is a view illustrating an example in which the accuracy of data search in the dictionary buffer decreases due to the hash collision in FIG. 8.

FIG. 9 illustrates an example in which new input data is compared with data in the dictionary buffer 21 by using the hash table 23 and the dictionary buffer 21 illustrated in FIG. 8. In the example illustrated in FIG. 9, "This is a hat." is input as the input data to the search unit 151A.

The hash calculation unit 22 calculates a hash value H(This) of "This" that is first four characters of the input data, by using the hash function H. The hash calculation unit 22 outputs the hash value H(This) to the hash table 23.

The hash table 23 outputs the dictionary address 200 associated with the hash value H(This) to the dictionary buffer 21. That is, the hash table 23 outputs the dictionary address 200 stored in the storage area with the address H(This) to the dictionary buffer 21.

The dictionary buffer 21 outputs the data (dictionary data) "That is a hut." stored in the dictionary address 200 to the match comparator 24.

The match comparator 24 compares the input data "This is a hut." with the dictionary data "That is a hat." to obtain the length of a portion "Th" continuously matching from the start (here, match length is 2.). The match comparator 24 outputs, for example, (200, 2) indicating a combination of the dictionary address and the match length as a search result. This means that the two characters "Th" at the start of the input data have been converted into the search result (200, 2) by the dictionary encoding of the search unit 151A, and the remaining character string "is is a hat." has failed to be converted into the combination of the dictionary address and the match length.

The dictionary data "This is a hat." is stored in the address 100 of the dictionary buffer 21. Therefore, if the hash collision of H(This)=H(That) does not occur, the match comparator 24 acquires the dictionary data, which is stored in the address 100 of the dictionary buffer 21 and exactly matches the input data, and obtains 14 that is the length of the whole data as a match length between the input data and the dictionary data. In this case, the match comparator 24 outputs (100, 14) indicating a combination of the dictionary address and the match length as a search result. This means that the whole input data can be converted into the search result (100, 14) by the dictionary encoding by the search unit 151A.

In this manner, when the hash collision of H(This)=H(That) occurs, not the dictionary data "This is a hat." but the dictionary data "That is a hut." is acquired from the dictionary buffer 21 as a target to be compared with the input data "This is a hat.", and thus, the search accuracy of the dictionary buffer 21 deteriorates. Then, the input data "This is a hat." is compared with the dictionary data "That is a hut.", so that the character string in the input data to be converted into the combination of the dictionary address and the match length becomes shorter than that in the case of being compared with the dictionary data "This is a hat.". Therefore, there is a possibility that the compression efficiency deteriorates, for example, in a case where input data is compressed using conversion into a combination of a dictionary address and a match length.

Therefore, when there is a bit position at which values do not change at all in one or more data portions of a specific unit (for example, in units of bytes) included in input data, the search unit 151 of the compression device 15 according to the present embodiment determines a hash function that does not use the values at the bit position as a hash function used to calculate a hash value of the input data. Note that, in a case where there is a bit position where a ratio of values which are 0 is equal to or higher than a first threshold in the one or more data portions of the specific unit included in the input data, the search unit 151 may determine a hash function that does not use the values at the bit position as the hash function used to calculate the hash value of the input data. Alternatively, in a case where there is a bit position where a ratio of values which are 1 is equal to or higher than a first threshold in the one or more data portions of the specific unit included in the input data, the search unit 151 may determine a hash function that does not use the values at the bit position as the hash function used to calculate the hash value of the input data. With such a determination of the hash function, a probability of occurrence of a hash collision can be reduced.

A relationship between a hash function and a hash collision will be specifically described with reference to FIGS. 10 and 11.

Figure 10:
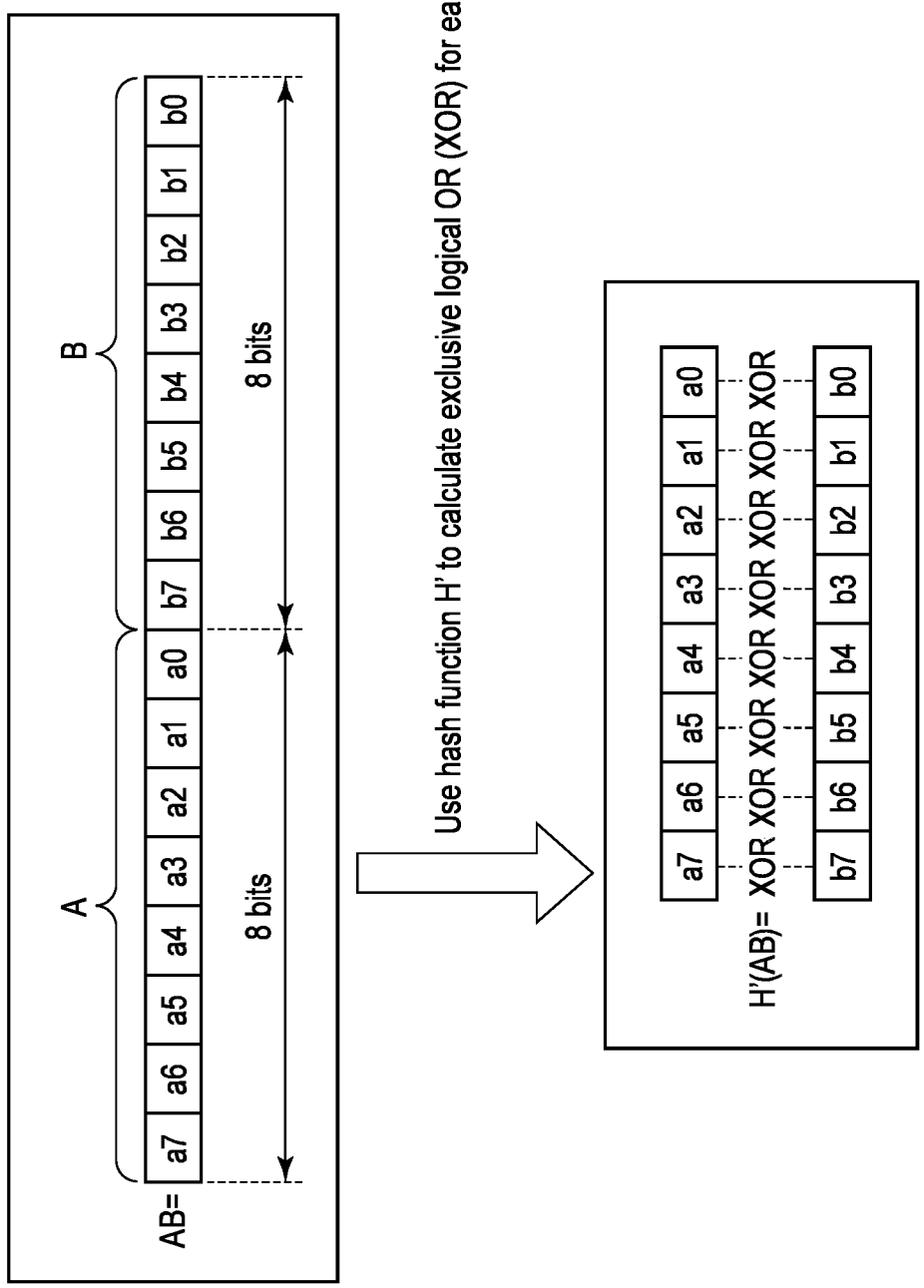
FIG. 10 is a view illustrating an example of a hash function that causes a hash collision.

FIG. 10 illustrates an example of a hash function H' that causes a hash collision. Here, a case where an input to the hash function is data of two characters (two bytes) "AB" will be exemplified.

The data of two characters "AB" includes an 8-bit bit data string $\{a7, a6, a5, a4, a3, a2, a1, a0\}$ corresponding to the character "A" and an 8-bit bit data string $\{b7, b6, b5, b4, b3, b2, b1, b0\}$ corresponding to the character "B". Here, an indicates one of bit values that constitute the character "A". Further, bn indicates one of bit values that constitute the character "B". The suffix n indicates an order (position) in a bit data string constituting one character, and the suffix n of an upper bit has a larger value. The suffix n is any value from 0 to 7. Note that a bit constituting a bit data string is also referred to as an n-th bit using the suffix n.

The hash function H' outputs an exclusive logical OR (XOR) of data portions that are obtained by dividing the input data in units of characters (units of bytes). More specifically, the hash function H' outputs an exclusive logical OR of bit values for each bit position using the data portions in units of characters. That is, the hash value H'(AB) obtained by inputting the data "AB" to the hash function H' is expressed by the following formula.

$$H'(A,B)=A^\wedge B=\{a7^\wedge b7, a6^\wedge b6, a5^\wedge b5, a4^\wedge b4, a3^\wedge b3, a2^\wedge b2, a1^\wedge b1, a0^\wedge b0\}$$

Note that the symbol "^" represents an exclusive logical OR operation.

Here, a case where input data is text data is considered. The text data is data described in ASCII codes. ASCII code is any value from 0 to 127. That is, ASCII code is data whose most significant bit (the seventh bit) is always 0.

An example of calculating a hash value using a specific value of a bit data string will be described. For example, it is assumed that A=8'b0111_1101, B=8'b0000_0010, X=8'b0111_1111, and Y=8'b0000_0000. Note that eight values subsequent to "8'b", each of which is 0 or 1, indicate a bit data string of 8 bits.

A hash value H'(AB) of data "AB" and a hash value H'(XY) of data "XY" calculated using the hash function H' are given as follows.

$$H'(AB)=8'b0111\_1101^\wedge 8'b0000\_0010=8'b0111\_1111$$

$$H'(XY)=8'b0111\_1111^\wedge 8'b0000\_0000=8'b0111\_1111$$

In this manner, the hash value H'(AB) of the data "AB" and the hash value H'(XY) of the data "XY" become the same value in the calculation of the hash value using the hash function H', so that the hash collision occurs.

Therefore, in the compression device 15 of the present embodiment, attention is paid to the fact that a most significant bit of a data portion in the character unit (that is, in the unit of one byte) included in input data is always 0 when it is determined that the input data is text data. Specifically, the search unit 151 of the compression device 15 determines a hash function H that does not use the most significant bit as the hash function to calculate a hash value of input data, instead of the hash function H' to calculate the exclusive logical OR for each bit position using all the bit values of the data portions in units of characters. For example, the hash function H is configured to calculate an exclusive logical OR of bits other than the most significant bits, instead of calculating an exclusive logical OR of the most significant bits.

Figure 11:
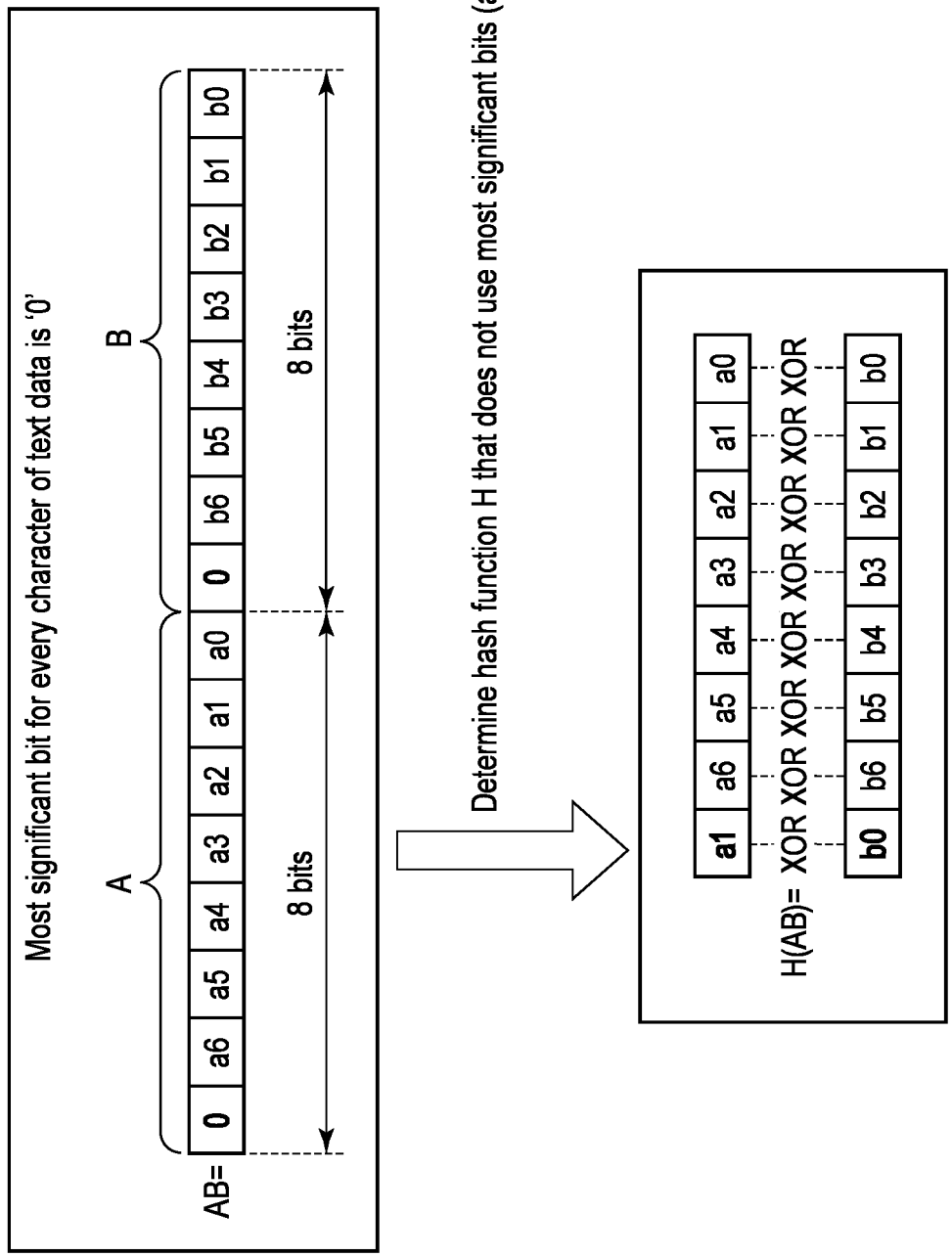
FIG. 11 is a view illustrating an example of a hash function for reducing the probability of occurrence of a hash collision used in the compression device according to the first embodiment.

FIG. 11 illustrates an example of the hash function H that reduces the probability of occurrence of the hash collision. The data "AB", which is an example of data input to the hash function H, is similar to that described above with reference to FIG. 10.

As illustrated in FIG. 11, a value of a most significant bit a7 of a bit data string corresponding to a character "A" is always 0. In addition, a value of a most significant bit b7 of a bit data string corresponding to a character "B" is always 0.

Therefore, the search unit 151 determines a hash function H that does not use the most significant bits a7 and b7 as a hash function to calculate a hash value of the input data. In the example illustrated in FIG. 11, the hash function H is configured to calculate an exclusive logical OR of the first bit a1 of the character "A" and the zeroth bit b0 of the character "B", instead of calculating an exclusive logical OR of the most significant bits a7 and b7. Therefore, a hash value H(AB) obtained by inputting the data "AB" to the hash function H is expressed by the following formula.

$$H(AB)=\{a1^\wedge b0, a6^\wedge b6, a5^\wedge b5, a4^\wedge b4, a3^\wedge b3, a2^\wedge b2, a1^\wedge b1, a0^\wedge b0\}$$

When determining that the input data is text data, the search unit 151 changes the hash function to calculate the hash value of the input data, for example, from the hash function H' to the hash function H.

An example of calculating a hash value using a specific value of a bit data string will be described. It is assumed that A=8'b0111_1101, B=8'b0000_0010, X=8'b0111_1111, and Y=8'b0000_0000 similarly to the example described above with reference to FIG. 10.

A hash value H(AB) of data "AB" and a hash value H(XY) of data "XY" calculated using the hash function H are given as follows.

$$H(AB)=8'b0111\_1101^\wedge 8'b0000\_0010=8'b0111\_1111$$

$$H(XY)=8'b1111\_1111^\wedge 8'b0000\_0000=8'b1111\_1111$$

In this manner, the hash value H(AB) of the data "AB" and the hash value H(XY) of the data "XY" become different values in the calculation of the hash value using the hash function H, so that the hash collision can be avoided.

Since the possibility of occurrence of the hash collision can be suppressed, the possibility that the search unit 151 can acquire dictionary data, which is appropriate as a target to be compared with input data, from the dictionary buffer 21 is increased. That is, the search accuracy of the dictionary buffer 21 is improved. Therefore, the compression efficiency is improved, for example, when the input data is compressed by utilizing conversion of the input data into a combination of a dictionary address and a match length using the dictionary buffer 21.

The example of a simple hash function has been described in order to facilitate understanding of the description in the above-described example, but in practice, a more complex hash function may be used. Even in a case where any hash function is used, if a bit having a bias in an appearing value exists in data portions of a specific unit included in input data, the search unit 151 changes the hash function to a hash function that does not use the bit. As a result, it is possible to reduce the possibility of the hash collision.

FIG. 12 illustrates an example of a configuration of the search unit 151. The search unit 151 includes a data discrimination unit 20, a dictionary buffer 21, a hash calculation unit 22, a hash table 23, and a match comparator 24.

The data discrimination unit 20 and the hash calculation unit 22 determine a hash function to be used for input data on the basis of the input data. The hash calculation unit 22 calculates a hash value using the determined hash function and at least a part of the input data.

Hereinafter, an operation of the data discrimination unit 20 and an operation of the hash calculation unit 22 will be specifically described, respectively.

First, the data discrimination unit 20 receives input data. The data discrimination unit 20 determines what kind of data the input data is. Specifically, the data discrimination unit 20 retains, for example, N-byte data after the input is started. N is an integer of one or more. Further, the data discrimination unit 20 analyzes (evaluates) the N-byte data to determine a type of the input data, the presence or absence of a bit (bit position) having a value bias in one or more data portions of a specific unit that constitute the input data, and the like. The type of the input data is, for example, a file format. Each of the data portions of the specific unit is, for example, a data portion in a unit of one byte (that is, a data portion in a unit of one character).

The data discrimination unit 20 generates information for determining a hash function to be used by the hash calculation unit 22 on the basis of the determination result regarding the input data. The information for determining a hash function is also referred to as hash function information. The hash function information includes, for example, information indicative of a hash function itself. Alternatively, the hash function information may be information for selecting one hash function from multiple hash functions (for example, identification information of a hash function).

The data discrimination unit 20 outputs the generated hash function information to the hash calculation unit 22. In addition, the data discrimination unit 20 outputs the input data to the hash calculation unit 22, the match comparator 24, and the dictionary buffer 21.

Some examples in which the data discrimination unit 20 analyzes input data to generate hash function information will be described.

(1) Input Data Composed of Data Portions Including a Bit that is Always 0 or a Bit that is Always 1

The data discrimination unit 20 detects that the i-th bit is always 0 or the i-th bit is always 1 in N data portions in units of bytes that constitute input data. Note that i is an integer of zero or more and less than m. When each of the N data portions has a length of eight bits (=one byte), m is eight.

When detecting that the i-th bit is always 0 in the N data portions in units of bytes, the data discrimination unit 20 generates hash function information for determining a hash function that does not use the i-th bit. In addition, when detecting that the i-th bit is always 1 in the N data portions in units of bytes, the data discrimination unit 20 generates hash function information for determining a hash function that does not use the i-th bit of a data portion.

(2) Input Data Composed of Data Portions Including a Bit with High Ratio of 0 or a Bit with High Ratio of 1

The data discrimination unit 20 calculates a ratio of bits whose values are 0 among N i-th bits included in the respective N data portions in units of bytes that constitute input data (hereinafter, referred to as the ratio of the i-th bits being 0) or a ratio of bits whose values are 1 among the N i-th bits (hereinafter, referred to as the ratio of the i-th bits being 1). When the ratio of the i-th bits being 0 or the ratio of the i-th bits being 1 is equal to or higher than a first threshold (for example, 95%), the data discrimination unit 20 generates hash function information for determining a hash function that does not use the i-th bit of a data portion. Alternatively, the data discrimination unit 20 may generate hash function information for determining a hash function in which the number of times (or frequency) of using the i-th bit of a data portion is smaller than the number of times of using each bit other than the i-th bit.

In addition, when the ratio of the i-th bits being 0 is higher than a ratio at which each bit other than the i-th bit is 0, the data discrimination unit 20 may generate hash function information for determining a hash function that does not use the i-th bit of a data portion or hash function information for determining a hash function in which the number of times of using the i-th bit of a data portion is smaller than the number of times of using each bit other than the i-th bit.

Further, when the ratio of the i-th bits being 1 is higher than a ratio at which each bit other than the i-th bit is 1, the data discrimination unit 20 may generate hash function information for determining a hash function that does not use the i-th bit of a data portion or hash function information for determining a hash function in which the number of times of using the i-th bit of a data portion is smaller than the number of times of using each bit other than the i-th bit.

(3) Input Data Composed of Data Portions Including a Bit with Low Ratio of 0 or a Bit with Low Ratio of 1

The data discrimination unit 20 calculates a ratio of bits whose values are 0 among N i-th bits included in the respective N data portions in units of bytes that constitute input data (hereinafter, referred to as the ratio of the i-th bits being 0) or a ratio of bits whose values are 1 among the N i-th bits (hereinafter, referred to as the ratio of the i-th bits being 1). When the ratio of the i-th bits being 0 or the ratio of the i-th bits being 1 is equal to or lower than a second threshold (for example, 5%), the data discrimination unit 20 generates hash function information for determining a hash function that does not use the i-th bit of a data portion. Alternatively, the data discrimination unit 20 may generate hash function information for determining a hash function in which the number of times of using the i-th bit of a data portion is smaller than the number of times of using each bit other than the i-th bit.

In addition, when the ratio of the i-th bits being 0 is lower than a ratio at which each bit other than the i-th bit is 0, the data discrimination unit 20 may generate hash function information for determining a hash function that does not use the i-th bit of a data portion or hash function information for determining a hash function in which the number of times of using the i-th bit of a data portion is smaller than the number of times of using each bit other than the i-th bit.

Further, when the ratio of the i-th bits being 1 is lower than a ratio at which each bit other than the i-th bit is 1, the data discrimination unit 20 may generate hash function information for determining a hash function that does not use the i-th bit of a data portion or hash function information for determining a hash function in which the number of times of using the i-th bit of a data portion is smaller than the number of times of using each bit other than the i-th bit.

Note that, since the value of each bit is either 0 or 1, the fact that the ratio of the i-th bits being 0 is equal to or higher than the first threshold described in (2) has the same meaning as the fact that the ratio of the i-th bits being 1 is equal to or lower than the second threshold described in (3). In addition, the fact that the ratio of the i-th bits being 1 is equal to or higher than the first threshold described in (2) has the same meaning as the fact that the ratio of the i-th bits being 0 is equal to or less than the second threshold described in (3).

Next, the hash calculation unit 22 determines a hash function used to calculate a hash value of input data by using the hash function information generated by the data discrimination unit 20. The hash calculation unit 22 calculates a hash value of at least a part of input data of a specific unit (that is, current input data) among the whole input data, such as a file, by using the determined hash function. The hash calculation unit 22 outputs the calculated hash value to the hash table 23.

The operations of the dictionary buffer 21, the hash table 23, and the match comparator 24 illustrated in FIG. 12 are similar to the operations of the dictionary buffer 21, the hash table 23, and the match comparator 24 of the search unit 151A described above with reference to FIG. 3.

FIG. 13 illustrates a specific operation example of the data discrimination unit 20 and the hash calculation unit 22. In the example illustrated in FIG. 13, input data "Alice was beginning to get very tired of sitting by her sister on the bank" is input to the data discrimination unit 20.

The data discrimination unit 20 analyzes first N-byte data of the input data. N is any value from one to the length of the whole input data (here, 74). For example, when N=19, the data discrimination unit 20 analyzes first 19-byte data "Alice was beginning".

More specifically, the data discrimination unit 20 divides N-byte data to obtain data portions in units of characters (that is, units of bytes). Then, the data discrimination unit 20 determines whether all the data portions are ASCII codes. An ASCII code is any value from 0 to 127. If a data portion is an ASCII code, a most significant bit of the data portion is 0. Therefore, the data discrimination unit 20 determines whether all the most significant bits of the data portions are 0, thereby determining whether all the data portions are ASCII codes.

When all the most significant bits of the data portions are 0, that is, when all the data portions are any value from 0 to 127, the data discrimination unit 20 determines that the input data is text data composed of ASCII codes. In accordance with determining that the input data is text data, the data discrimination unit 20 generates hash function information for determining a hash function that does not use the most significant bit of a data portion. The hash calculation unit 22 can determine the hash function that does not use the most significant bit of a data portion as the hash function used to calculate the hash value of the input data by using the generated hash function information.

When the most significant bit of at least one of the data portions is 1, that is, at least one of the data portions is a value other than ASCII codes, the data discrimination unit 20 determines that the input data is not text data. Values other than ASCII codes are any value from 128 to 255. In accordance with determining that the input data is not text data, the data discrimination unit 20 generates hash function information for determining a hash function that uses all bits of a data portion. The hash calculation unit 22 can determine the hash function that uses all bits of a data portion as the hash function used to calculate the hash value of the input data by using the generated hash function information.

With the configurations illustrated in FIGS. 12 and 13, the search unit 151 can reduce the probability of the hash collision and improve the search accuracy of the dictionary buffer 21. Therefore, the compression efficiency is improved, for example, in a case where the input data is compressed by utilizing conversion of the input data into a combination of a dictionary address and a match length using the dictionary buffer 21.

Figure 14:
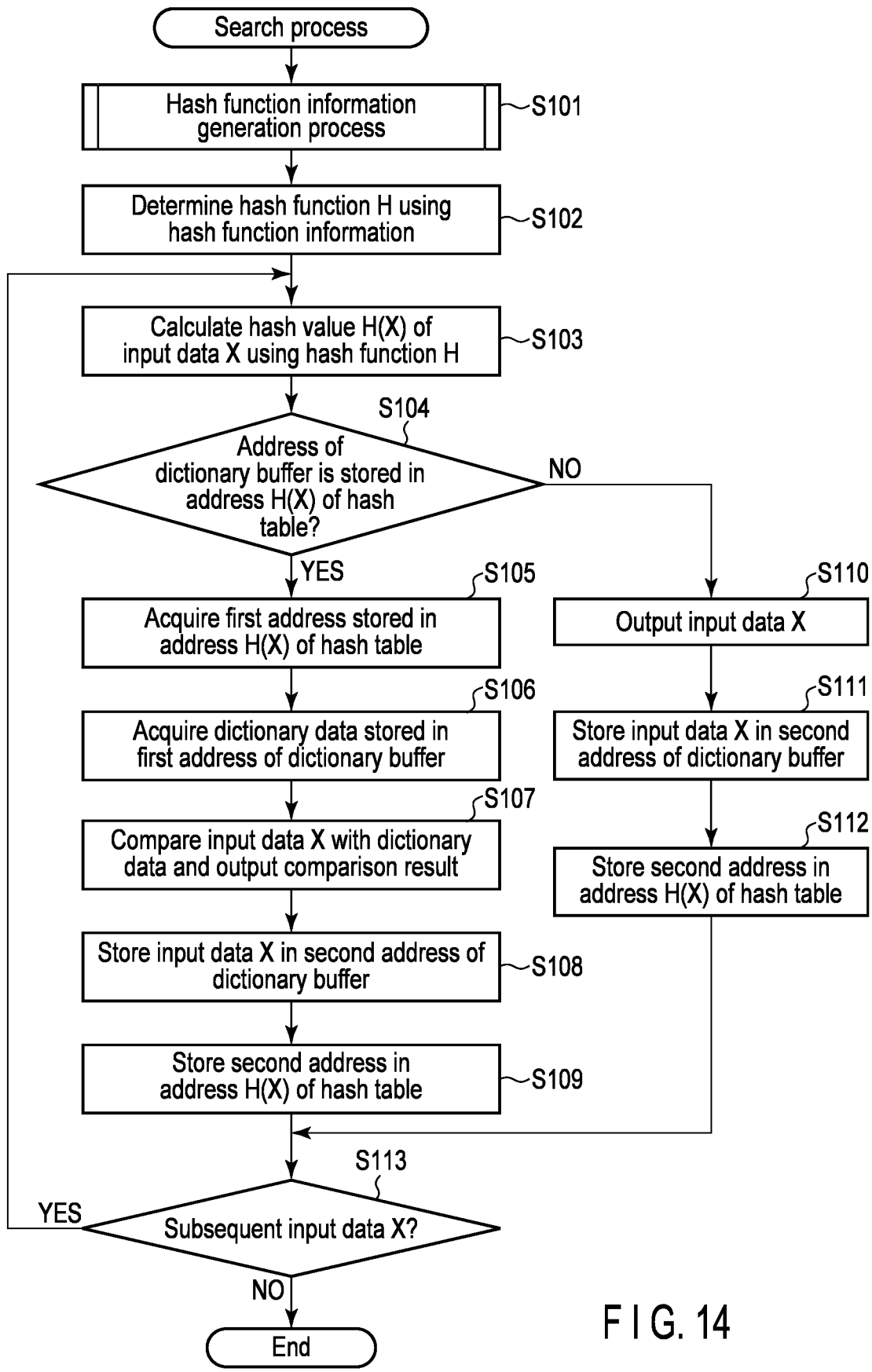
FIG. 14 is a flowchart illustrating an example of the procedure of a search process executed in the compression device according to the first embodiment.

FIG. 14 is a flowchart illustrating an example of the procedure of a search process executed in the search unit 151 of the compression device 15. The search process is a process for searching the dictionary buffer 21 and performing dictionary encoding on input data X.

First, the search unit 151 executes a hash function information generation process on the input data X (step S101). The hash function information generation process is a process for generating hash function information using the input data X. The hash function information is information for determining a hash function used to calculate a hash value of the input data X. A specific procedure of the hash function information generation process will be described later with reference to a flowchart of FIG. 15.

The search unit 151 determines a hash function H using the generated hash function information (step S102). The search unit 151 generates the hash function H, for example, by using the hash function information. Alternatively, the search unit 151 may select one hash function H from hash functions prepared in advance, by using the hash function information.

The search unit 151 calculates a hash value H(X) of the input data X using the determined hash function H (step S103). The search unit 151 calculates the hash value H(X) using, for example, the hash function H and at least a part of the input data X. The at least a part of the input data X is, for example, first N-byte data of the input data X.

Next, the search unit 151 determines whether an address of the dictionary buffer 21 is stored in an address H(X) of the hash table 23 (step S104). The search unit 151 uses the calculated hash value H(X) of the input data X as an address for specifying a memory location in the hash table 23.

When an address of the dictionary buffer 21 is stored in the address H(X) of the hash table 23 (YES in step S104), the search unit 151 acquires an address stored in the address H(X) of the hash table 23 (hereinafter, referred to as a first address) (step S105). The search unit 151 acquires dictionary data stored in the first address of the dictionary buffer 21 (step S106). Then, the search unit 151 compares the input data X with the acquired dictionary data, and outputs the comparison result to the entropy encoding unit 152 (step S107). The comparison result includes, for example, the first address, and a match length between the input data X and the dictionary data.

Next, the search unit 151 stores the input data X in a second address of the dictionary buffer 21 (step S108). The second address is an address different from the first address. The second address is, for example, an address indicating a storage area subsequent to a storage area in which previous input data is stored. The search unit 151 stores the second address in the address H(X) of the hash table 23 (step S109), and proceeds to step S113.

When an address of the dictionary buffer 21 is not stored in the address H(X) of the hash table 23 (NO in step S104), the search unit 151 outputs the input data X to the entropy encoding unit 152 (step S110). The search unit 151 stores the input data X in the second address of the dictionary buffer 21 (step S111). Then, the search unit 151 stores the second address in the address H(X) of the hash table 23 (step S112), and proceeds to step S113.

Next, the search unit 151 determines whether there is subsequent input data X (step S113). When there is subsequent input data X (YES in step S113), the search unit 151 returns to step S103 and performs a process for dictionary encoding of the subsequent input data X. The hash function H that has been already determined in step S102 is used to calculate a hash value of the subsequent input data X.

On the other hand, when there is no subsequent input data X (NO in step S113), the search unit 151 ends the search process.

Through the search process of FIG. 14 described above, the search unit 151 can search the dictionary buffer 21 and perform the dictionary encoding on the input data X. Specifically, when data at least partially matching the input data X is stored in the dictionary buffer 21, the search unit 151 can convert the input data X into a combination of a dictionary address and a match length. When data at least partially matching the input data X is not stored in the dictionary buffer 21, the search unit 151 outputs the input data X as it is.

In addition, the search unit 151 can newly register the input data X in the dictionary buffer 21. That is, after storing the input data X in the dictionary buffer 21, the search unit 151 stores the dictionary address (second address), which stores the input data X, in the hash table 23 so as to enable access to the input data X stored in the dictionary buffer 21 using the hash value H(X). As a result, the search unit 151 can use the input data X registered in the dictionary buffer 21 for the dictionary encoding of subsequent input data.

Figure 15:
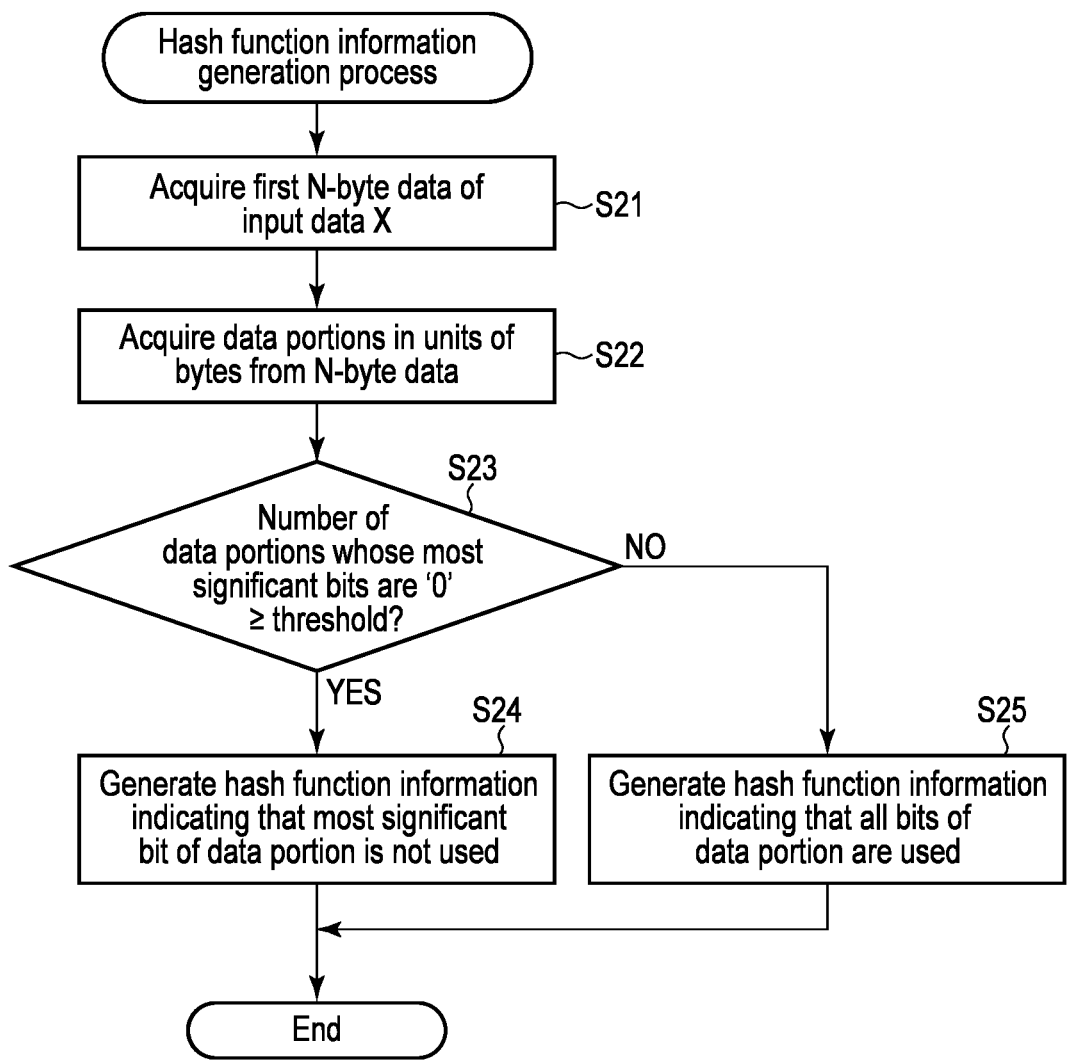
FIG. 15 is a flowchart illustrating an example of the procedure of a hash function information generation process executed in the compression device according to the first embodiment.

FIG. 15 is the flowchart illustrating an example of the procedure of the hash function information generation process executed in the search unit 151 of the compression device 15. The hash function information generation process is a process for generating hash function information using the input data X. The hash function information is information for determining a hash function used to calculate a hash value of the input data X. The hash function information generation process corresponds to step S101 in the search process described above with reference to the flowchart of FIG. 14. Here, a case of generating hash function information depending on whether the input data X is text data will be exemplified in order to facilitate understanding of the description.

First, the search unit 151 acquires first N-byte data of the input data X (step S21). N is an integer from one to the length in bytes of the input data X. Further, the search unit 151 acquires N data portions in units of bytes from the N-byte data (step S22).

Next, the search unit 151 determines whether a ratio of data portions whose most significant bits are 0 among the acquired N data portions is equal to or higher than a threshold (step S23). For example, if it is determined whether all the data portions are character data, that is, if it is determined whether the most significant bits are 0 in all the data portions, the threshold is one (=100%).

When the ratio of data portions whose most significant bits are 0 among the N data portions is equal to or higher than the threshold (YES in step S23), the search unit 151 generates hash function information indicating that the most significant bit of a data portion is not used (step S24), and ends the hash function information generation process. That is, the search unit 151 determines that the input data X is text data and generates the hash function information indicating that the most significant bit of a data portion is not used.

On the other hand, when the ratio of data portions whose most significant bits are 0 among the N data portions is lower than the threshold (NO in step S23), the search unit 151 generates hash function information indicating that all bits of a data portion are used (step S25), and ends the hash function information generation process. That is, the search unit 151 determines that the input data X is not text data and generates the hash function information indicating that all bits of a data portion are used.

Through the above hash function information generation process of FIG. 15, the search unit 151 can generate the hash function information depending on content of the input data X. The search unit 151 (more specifically, the hash calculation unit 22) can use the generated hash function information to determine either the hash function that does not use the most significant bit of a data portion or the hash function that uses all bits of a data portion.

Note that the search unit 151 may determine whether a ratio of data portions in which i-th bits are 0 among the acquired N data portions is equal to or higher than the first threshold in step S23. Here, i is an integer of zero or more and less than m. Here, m is eight since each of the N data portions has a length of eight bits (=one byte). The search unit 151 determines whether the ratio of data portions in which the i-th bits are 0 among the N data portions is equal to or higher than the first threshold for each of the zeroth to the (m−1)th bits by, for example, increasing i by one from zero to (m−1).

When the i-th bit being 0 at the ratio equal to or higher than the first threshold exists in the N data portions, the search unit 151 generates hash function information indicating that the i-th bit of a data portion is not used. As a result, the search unit 151 can determine a hash function that does not use the i-th bit of a data portion by using the hash function information.

When the i-th bit being 0 at the ratio equal to or higher than the first threshold does not exist in the N data portions, the search unit 151 generates hash function information indicating that all bits of a data portion are used. As a result, the search unit 151 can determine a hash function that uses all bits of a data portion by using the hash function information.

Further, the search unit 151 may determine whether a ratio of data portions in which the i-th bits are 1 among the acquired N data portions is equal to or higher than the first threshold in step S23. The search unit 151 determines whether the ratio of data portions in which the i-th bits are 1 among the N data portions is equal to or higher than the first threshold for each of the zeroth to the (m−1)th bits by, for example, increasing i by one from zero to (m−1).

When the i-th bit being 1 at the ratio equal to or higher than the first threshold exists in the N data portions, the search unit 151 generates hash function information indicating that the i-th bit of a data portion is not used. As a result, the search unit 151 can determine a hash function that does not use the i-th bit of a data portion by using the hash function information.

When the i-th bit being 1 at the ratio equal to or higher than the first threshold does not exist in the N data portions, the search unit 151 generates hash function information indicating that all bits of a data portion are used. As a result, the search unit 151 can determine a hash function that uses all bits of a data portion by using the hash function information.

Second Embodiment

In the first embodiment, the search unit 151 generates hash function information depending on content of input data. On the other hand, in a second embodiment, a search unit 151 generates hash function information using input data information. The input data information is information related to content of input data.

A configuration of a compression device 15 according to the second embodiment is similar to that of the compression device 15 according to the first embodiment, and only an operation of a data discrimination unit 20 of the search unit 151 is different between the second embodiment and the first embodiment. Hereinafter, differences from the first embodiment will be mainly described.

FIG. 16 illustrates a configuration example of the search unit 151 provided in the compression device 15 according to the second embodiment. The search unit 151 of the second embodiment includes the data discrimination unit 20, a dictionary buffer 21, a hash calculation unit 22, a hash table 23, and a match comparator 24, which is similar to the search unit 151 of the first embodiment.

The data discrimination unit 20 receives input data information in addition to input data. The input data information is information related to the i-th bit having a bias in appearing values in one or more data portions of a specific unit that constitute the input data. More specifically, the input data information is information related to a ratio of bits which are 0 among one or more i-th bits that are included in the one or more data portions of the specific unit, respectively, constituting the input data, or a ratio of bits which are 1 among the one or more i-th bits. The i-th bit is the i-th bit of a bit data string that forms a data portion of the specific unit. The data discrimination unit 20 generates hash function information using the input data information. The data discrimination unit 20 outputs the generated hash function information and the input data to the hash calculation unit 22.

The hash calculation unit 22 determines a hash function used to calculate a hash value of the input data by using the hash function information. The hash calculation unit 22 calculates the hash value of the input data (more specifically, a hash value of at least a part of the input data) by using the determined hash function.

Operations of the dictionary buffer 21, the hash table 23, and the match comparator 24 are similar to those described in the first embodiment.

FIG. 17 illustrates a specific operation example of the data discrimination unit 20 and the hash calculation unit 22. First, the operation of the data discrimination unit 20 will be described with some specific examples of input data information.

(1) Case where Input Data Information Indicates Format of Input Data

Input data information indicates a format of input data. More specifically, the input data information indicates, for example, that the input data is text data (text file). In the text data, most significant bits of data portions in units of bytes (units of characters) are always 0. Therefore, when the input data information indicates that the input data is text data, the data discrimination unit 20 generates hash function information for determining a hash function that does not use the most significant bit of a data portion in the byte unit.

In addition, the input data information may indicate, for example, that the input data is not text data, or that the input data is data (file) in a format different from text data. When the input data information indicates that the input data is not text data, the data discrimination unit 20 generates hash function information for determining a hash function using all bits of a data portion.

(2) Case where Input Data Information Indicates Bit that is Always 0 or Bit that is Always 1

Input data information indicates that, for example, the i-th bit is always 0 in one or more data portions of a specific unit that constitute input data. The data discrimination unit 20 generates hash function information for determining a hash function that does not use the i-th bit of a data portion of the specific unit by using the input data information indicating that the i-th bit is always 0.

For example, when the input data is text data, the input data information may indicate that most significant bit (seventh bit) is always 0 in data portions in units of bytes (that is, units of characters) that constitute the input data. The data discrimination unit 20 generates hash function information for determining a hash function that does not use the most significant bit of a data portion in the unit of byte by using the input data information indicating that the most significant bit is always 0.

The same applies to a case where input data information indicates that the i-th bit is always 1 in one or more data portions of a specific unit that constitute the input data.

(3) Case where Input Data Information Indicates Bit with High Ratio of 0 or Bit with High Ratio of 1

Input data information indicates that, for example, a ratio of the i-th bits being 0 is high in one or more data portions of a specific unit that constitute input data. More specifically, the input data information may include information indicating the ratio of the i-th bits being 0, or may include information indicating that the ratio of the i-th bits being 0 is equal to or higher than a first threshold (for example, 95%). Alternatively, the input data information may indicate that the ratio of the i-th bits being 0 is higher than a ratio at which each bit other than the i-th bit is 0.

The data discrimination unit 20 generates hash function information for determining a hash function that does not use the i-th bit of a data portion of the specific unit by using the input data information indicating that the ratio of the i-th bits being 0 is high. Alternatively, the data discrimination unit 20 may generate hash function information for determining a hash function in which the number of times (or frequency) of using the i-th bit of a data portion of the specific unit is smaller than the number of times of using each bit other than the i-th bit by using the input data information indicating that the ratio of the i-th bits being 0 is high.

The same applies to a case where input data information indicates that a ratio of the i-th bits being 1 is high in one or more data portions of the specific unit that constitute the input data.

(4) Case where Input Data Information Indicates Bit with Low Ratio of 0 or Bit with Low Ratio of 1

Input data information indicates that, for example, a ratio of the i-th bits being 0 is low in one or more data portions of a specific unit that constitute input data. More specifically, the input data information may include information indicating the ratio of the i-th bits being 0, or may include information indicating that the ratio of the i-th bits being 0 is equal to or lower than a second threshold (for example, 5%). Alternatively, the input data information may indicate that the ratio of the i-th bits being 0 is lower than a ratio at which each bit other than the i-th bit is 0.

The data discrimination unit 20 generates hash function information for determining a hash function that does not use the i-th bit of a data portion of the specific unit by using the input data information indicating that the ratio of the i-th bits being 0 is low. Alternatively, the data discrimination unit 20 may generate hash function information for determining a hash function in which the number of times of using the i-th bit of a data portion of the specific unit is smaller than the number of times of using each bit other than the i-th bit by using the input data information indicating that the ratio of the i-th bits being 0 is low.

The same applies to a case where input data information indicates that a ratio of the i-th bits being 1 is low in one or more data portions of the specific unit that constitute the input data.

Note that, since the value of each bit is either 0 or 1, the fact that the ratio of the i-th bits being 0 is high described in (3) has the same meaning as the fact that the ratio of the i-th bits being 1 is low described in (4). In addition, the ratio of the i-th bits being 1 is high described in (3) has the same meaning as the ratio of the i-th bits being 0 is low described in (4).

The pieces of input data information described in (1) to (4) above are given as examples, and the input data information may be any form of information as long as the information directly or indirectly indicates a bit having a bias in appearing values in one or more data portions of a specific unit that constitute input data.

The hash calculation unit 22 determines a hash function used to calculate a hash value of input data according to the hash function information generated by the data discrimination unit 20. Further, the hash calculation unit 22 calculates the hash value of the input data using the determined hash function.

With the configurations illustrated in FIGS. 16 and 17, when there is a bit having a bias in appearing values in data portions constituting input data, the search unit 151 can determine a hash function that reduces a probability of a hash collision by using input data information. As a result, the search accuracy of the dictionary buffer 21 can be improved. Therefore, the compression efficiency is improved, for example, in a case where the input data is compressed by utilizing conversion of the input data into a combination of a dictionary address and a match length using the dictionary buffer 21.

Note that the data discrimination unit 20 may generate hash function information by using not only input data information but also a discrimination result related to content of input data. An operation of the data discrimination unit 20 to discriminate the content of the input data is similar to that described above in the first embodiment.

As the procedure of a search process executed in the search unit 151 of the compression device 15 according to the second embodiment, the search process described with reference to the flowchart of FIG. 14 in which the procedure illustrated in a flowchart of FIG. 18 is executed as the hash function information generation process in step S101 is executed.

FIG. 18 is the flowchart illustrating an example of the procedure of the hash function information generation process executed in the search unit 151 of the compression device 15.

First, the search unit 151 acquires input data information (step S31). The input data information may be input to the search unit 151 together with input data X, or may be input by an operation performed by a user.

The search unit 151 generates hash function information using the input data information (step S32). For example, when the input data information indicates that the input data X is text data, the search unit 151 generates hash function information indicating that a most significant bit of a data portion in a unit of a byte is not used. For example, when the input data information indicates that the i-th bits in data portions in units of bytes included in the input data X are always 0, the search unit 151 generates hash function information indicating that the i-th bit of a data portion in the byte unit is not used.

Through the above hash function information generation process of FIG. 18, the search unit 151 can generate the hash function information based on the input data information. The search unit 151 (more specifically, the hash calculation unit 22) can determine, for example, a hash function that does not use a specific bit of a data portion by using the generated hash function information.

Third Embodiment

In the first embodiment, the search unit 151 generates hash function information depending on content of input data. On the other hand, in a third embodiment, a search unit 151 converts input data and generates hash function information corresponding to content of data obtained by the conversion (converted data).

A configuration of a compression device 15 according to the third embodiment is similar to that of the compression device 15 according to the first embodiment. The third embodiment is different from the first embodiment only in that a configuration for converting input data is added to the search unit 151 and the converted data is processed instead of the input data. Hereinafter, differences from the first embodiment will be mainly described.

FIG. 19 illustrates a configuration example of the search unit 151 included in the compression device 15 according to the third embodiment. The search unit 151 includes a data discrimination unit 20, a dictionary buffer 21, a hash calculation unit 22, a hash table 23, a match comparator 24, and a data conversion unit 25.

The data conversion unit 25 receives input data. The data conversion unit 25 converts the input data.

Specifically, the data conversion unit 25 converts data portions in units of bytes that constitute the input data into index numbers in order from the start. When a data portion in the byte unit to be converted is a value input to the data conversion unit 25 for the first time, the data conversion unit 25 assigns an index number to the value. That is, the data conversion unit 25 assigns an index number to a value in response to the first appearance of the value as a data portion in the byte unit to be converted. The index number is sequentially assigned from 0, and is increased by 1 every time a value that is input for the first time appears. Therefore, a smaller index number is assigned to a value that has appeared earlier.

The conversion of input data by the data conversion unit 25 will be described using a specific example of the input data. Here, a case where pieces of input data are "10, 20, 44, 38, 88, 10, 88, 90, 2, 5, 100, . . . " in order from the start will be exemplified.

First, the data conversion unit 25 assigns an index number "0" to the value "10". The data conversion unit 25 assigns an index number "1" to the value "20". The data conversion unit 25 assigns an index number "2" to the value "44". The data conversion unit 25 assigns an index number "3" to the value "38". The data conversion unit 25 similarly assigns an index number to a subsequent value when the value first appears.

The data conversion unit 25 converts a value of the input data into an index number according to the assignment of the index number to the value of the input data. Specifically, the data conversion unit 25 converts the value "10" into the index number "0". The data conversion unit 25 converts the value "20" into the index number "1". The data conversion unit 25 converts the value "44" into the index number "2". The data conversion unit 25 converts the value "38" into the index number "3". The data conversion unit 25 similarly converts a subsequent value into an index number.

Therefore, the data conversion unit 25 converts the input data "10, 20, 44, 38, 88, 10, 88, 90, 2, 5, 100, . . . " into "0, 1, 2, 3, 4, 0, 4, 5, 6, 7, 8, . . . ". The data conversion unit 25 outputs the data obtained by the conversion to the data discrimination unit 20. The data obtained by the conversion is also referred to as converted data.

Further, the data conversion unit 25 generates a data conversion table indicating a correspondence relationship between a value of input data and an index number according to assignment of the index number to the value of the input data.

Figures 20, 21:
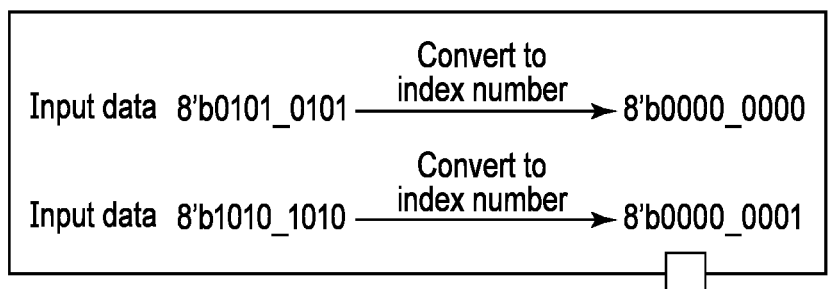
FIG. 20 is a view illustrating a configuration example of a data conversion table generated in the compression device according to the third embodiment.
FIG. 21 is a view illustrating an example in which a hash function that does not use a specific bit is determined in accordance with data conversion by a data conversion unit included in the search unit of FIG. 19.

FIG. 20 illustrates a configuration example of the data conversion table. The data conversion table illustrated in FIG. 20 is a data conversion table generated by the data conversion unit 25 when the pieces of input data "10, 20, 44, 38, 88, 10, 88, 90, 2, 5, 100, . . . " are input.

The data conversion table is used, for example, in a case of decoding encoded data that is obtained by dictionary encoding of input data. The data conversion unit 25 outputs the generated data conversion table together with compressed data. Further, a controller 4 (more specifically, a CPU 12) writes the data conversion table and the compressed data into a NAND flash memory 5 via a NAND I/F 13. The data conversion table is arranged, for example, in front of the compressed data. That is, the controller 4 adds the data conversion table in front of the compressed data and writes them into the NAND flash memory 5. Note that the data conversion unit 25 may send the data conversion table to an external device (for example, a decompression device 16) or a processing circuit that decodes the encoded data.

Operations of the data discrimination unit 20, the dictionary buffer 21, the hash calculation unit 22, the hash table 23, and the match comparator 24 are similar to the operations of the data discrimination unit 20, the dictionary buffer 21, the hash calculation unit 22, the hash table 23, and the match comparator 24 of the first embodiment, except that the input data is replaced with the converted data.

FIG. 21 illustrates an example in which a hash function that does not use a specific bit is determined according to data conversion. In the example illustrated in FIG. 21, it is assumed that values input as input data to the data conversion unit 25 are only two values of 8'b1010_1010 and 8'b0101_0101.

When the input data including these two values is analyzed, both values of 0 and 1 appear in all eight bits from the zeroth bit (least significant bit) to the seventh bit (most significant bit). Therefore, the data discrimination unit 20 does not detect a bit that is always 0 or a bit that is always 1 in the data portions in units of bytes that constitute the input data.

Therefore, for example, the data conversion unit 25 converts 8'b1010_1010 into an index number "0" (=8'b0000_0000), and converts 8'b0101_0101 into an index number "1" (=8'b0000_0001). That is, the data conversion unit 25 converts the input data into data composed of "0" and "1".

In data portions in units of bytes included in the converted data, all seven bits from the first bit to the seventh bit other than the least significant bit (zeroth bit) are 0. As a result, the data discrimination unit 20 can detect the first bit to the seventh bit which are always 0 in the data portions in units of bytes that constitute the converted data. Further, the data discrimination unit 20 generates, for example, hash function information for determining a hash function that does not use the first bit to the seventh bit of a data portion. The hash calculation unit 22 calculates a hash value of the converted data (more specifically, at least a part of the converted data) by using the hash function that does not use the first bit to the seventh bit in each data portion according to the hash function information.

Here, a case where each of data portions in units of bytes that constitute input data is any value increased from 0 by 3 is assumed as a more practical example. That is, each of the data portions in units of bytes is, for example, any value of 0, 3, 6, 9, . . . , and 252. In this case, the number of varieties of values to be input is 86 or less.

Since the number of varieties of values to be input is 86 or less, the data conversion unit 25 can convert values of the respective data portions in units of bytes which constitute the input data, into any index number from 0 to 85. That is, the data conversion unit 25 can convert the value of each of the data portions in units of bytes which constitute the input data, into an index number whose most significant bit is always 0. Therefore, the data discrimination unit 20 can generate, for example, hash function information for determining a hash function that does not use the most significant bit of a data portion. The hash calculation unit 22 calculates a hash value of the converted data by using the hash function that does not use the most significant bit of each data portion according to the hash function information. As a result, it is possible to reduce a probability of occurrence of a hash collision.

In addition, in a case where the number of varieties of values to be input is 129 or more, for example, the data conversion unit 25 buffers a specific amount of input data or the whole input data. Then, the data conversion unit 25 assigns an index number of 129 or more to a value having a low appearance frequency. As a result, it is possible to reduce a probability that the most significant bit of a value (data portion) included in the converted data is 1. Therefore, the data conversion unit 25 can convert the input data into data that is composed of index numbers having a low probability that the most significant bit is 1.

The data discrimination unit 20 and the hash calculation unit 22 calculate a hash value of the converted data by using the hash function that does not use the most significant bit. Alternatively, the data discrimination unit 20 and the hash calculation unit 22 may calculate a hash value of the converted data by using a hash function in which the number of times of using the most significant bit is smaller than the number of times of using each bit other than the most significant bit. As a result, it is possible to reduce a probability of occurrence of a hash collision.

With the configurations illustrated in FIGS. 19 to 21, the search unit 151 reduces the probability of occurrence of the hash collision by converting the input data when the number of varieties of values to be input is small. As a result, the search accuracy of the dictionary buffer 21 can be improved. Therefore, the compression efficiency is improved, for example, when the input data is compressed by utilizing conversion of the input data into a combination of a dictionary address and a match length using the dictionary buffer 21.

Figure 22:
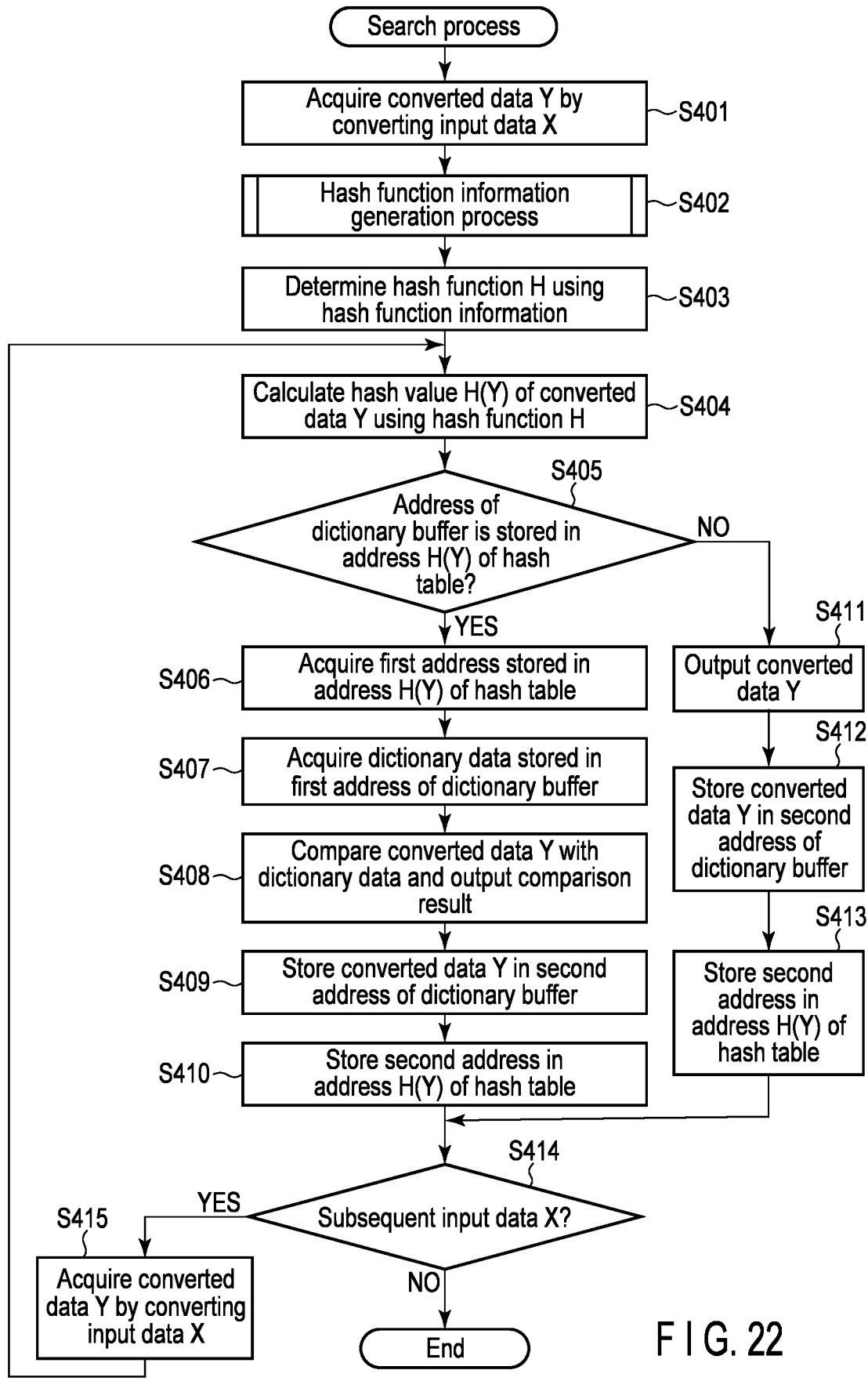
FIG. 22 is a flowchart illustrating an example of the procedure of a search process executed in the compression device according to the third embodiment.

FIG. 22 is a flowchart illustrating an example of the procedure of a search process executed in search unit 151 of compression device 15. The search process is a process for acquiring converted data Y which is obtained by converting input data X, searching the dictionary buffer 21, and performing dictionary encoding on the converted data Y.

First, the search unit 151 acquires the converted data Y obtained by converting the input data X (step S401). For example, the search unit 151 acquires the converted data Y by converting the input data X into indexes.

The search unit 151 executes a hash function information generation process for the converted data Y (step S402). A specific procedure of the hash function information generation process in step S402 may be obtained by replacing the input data X with the converted data Y in the hash function information generation process described above with reference to the flowchart of FIG. 15.

In addition, subsequent procedures from step S403 to step S413 are obtained by replacing the input data X with the converted data Y and replacing the hash value H(X) of the input data X with a hash value H(Y) of the converted data Y in the procedure from step S102 to step S112 in the search process described above with reference to the flowchart of FIG. 14.

After dictionary encoding of the converted data Y is completed in the procedure from step S403 to step S413, the search unit 151 determines whether there is subsequent input data X (step S414). When there is the subsequent input data X (YES in step S414), the search unit 151 acquires converted data Y obtained by converting the input data X (step S415), and returns to step S404. That is, the search unit 151 performs a process for dictionary encoding of the converted data Y which is obtained by converting the subsequent input data X. The hash function H that has been already determined in step S403 is used to calculate a hash value of the converted data Y. Note that the search unit 151 may acquire converted data which is obtained by converting the whole input data, such as a file, in step S401, instead of converting the input data X into the converted data Y for each specific unit in steps S401 and S415.

On the other hand, when there is no subsequent input data X (NO in step S414), the search unit 151 ends the search process.

Through the above search process of FIG. 22, the search unit 151 can search the dictionary buffer 21 after acquiring the converted data Y, which is obtained by converting the input data X, and perform the dictionary encoding on the converted data Y. Specifically, when data at least partially matching the converted data Y is stored in the dictionary buffer 21, the search unit 151 can convert the converted data Y into a combination of a dictionary address (first address) and a match length. When data at least partially matching the converted data Y is not stored in the dictionary buffer 21, the search unit 151 outputs the converted data Y as it is.

In addition, the search unit 151 can newly register the converted data Y in the dictionary buffer 21. That is, after storing the converted data Y in the dictionary buffer 21, the search unit 151 stores the dictionary address (second address) in the hash table 23, which stores the converted data Y, so as to enable access to the converted data Y stored in the dictionary buffer 21 using the hash value H(Y). As a result, the search unit 151 can use the converted data Y registered in the dictionary buffer 21 for dictionary encoding of converted data which is obtained by converting subsequent input data.

As described above, the search accuracy of data in the dictionary can be improved according to the first to third embodiments. The hash table 23 stores addresses that are associated with hash values, respectively. The dictionary buffer 21 includes storage areas which are specified by the addresses, respectively, and store pieces of data, respectively. The data discrimination unit 20 and the hash calculation unit 22 determine a first hash function to be used for first data in accordance with at least a part of the first data, and calculate a first hash value using the first hash function and at least a part of second data included in the first data. The match comparator 24 acquires third data from a storage area in the dictionary buffer 21 specified by a first address (dictionary read address) that is stored in the hash table 23 and is associated with the first hash value, and compares the second data with the third data.

Since the first hash function based on the first data is determined, the data discrimination unit 20 and the hash calculation unit 22 can calculate a hash value of the second data using the hash function having a low probability of causing a hash collision. As a result, the possibility that the match comparator 24 can acquire the appropriate third data as the target to be compared with the second data from the dictionary buffer 21 is increased. That is, the search accuracy of data in the dictionary buffer 21 can be improved. Therefore, the compression efficiency is improved, for example, in a case where the input data is compressed by utilizing the conversion of the input data into a combination of a dictionary address and a match length using the dictionary buffer 21.

Each of various functions described in the first to third embodiments may be realized by a circuit (e.g., processing circuit). An exemplary processing circuit may be a programmed processor such as a central processing unit (CPU). The processor executes computer programs (instructions) stored in a memory thereby performs the described functions. The processor may be a microprocessor including an electric circuit. An exemplary processing circuit may be a digital signal processor (DSP), an application specific integrated circuit (ASIC), a microcontroller, a controller, or other electric circuit components. The components other than the CPU described according to the embodiments may be realized in a processing circuit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A compression device comprising:
   a first storage unit configured to include first storage areas that each store a dictionary address corresponding to a piece of dictionary data and that each have a first storage area address which matches a hash value;
   a second storage unit configured to include second storage areas that each store data and that each have an associated address which matches the dictionary address stored in one of the first storage areas;
   a calculation unit configured to:
      determine a first hash function that changes depending on at least part of first data; and
      calculate a first hash value of at least part of second data by using the determined first hash function, the second data being a part of the first data; and
   a comparison unit configured to:
      acquire third data from a third storage area of the second storage areas, wherein the third storage area has the associated address that matches the dictionary address that is stored in a fourth storage area of the first storage areas, and the fourth storage area has the first storage area address that matches the calculated first hash value; and
      compare the second data with the third data to acquire a length of a matching portion between the second data and the third data; and an entropy encoding unit configured to perform entropy encoding, wherein
   the first data includes n-byte data comprised of one or more data portions,
   each of the one or more data portions has a length of m bits,
   n is an integer of one or more,
   m is an integer of two or more,
   the calculation unit is configured to:
      calculate a first ratio of bits which are 0 among one or more i-th bits that are each included in one of the one or more data portions, or a second ratio of bits which are 1 among the one or more i-th bits; and
      determine the first hash function based on the first ratio or the second ratio, the entropy encoding unit is configured to acquire encoded data by performing entropy encoding on a combination of the dictionary address stored in the fourth storage area and the length of the matching portion, and
   i is an integer of zero or more and less than m.

2. The compression device according to claim 1, wherein the calculation unit is configured to
   determine the first hash function that does not use the i-th bit when the first ratio or the second ratio exceeds a first threshold.

3. The compression device according to claim 1, wherein the calculation unit is configured to
   determine the first hash function in which a number of times of using the i-th bit is smaller than a number of times of using each of one or more bits other than the i-th bit when the first ratio or the second ratio is less than a second threshold.

4. The compression device according to claim 1, wherein the calculation unit is configured to:
   acquire information related to an i-th bit having a bias in an appearance value in the one or more data portions; and
   determine the first hash function in which a number of times of using the i-th bit is smaller than a number of times of using each of one or more bits other than the i-th bit, by using the information.

5. The compression device according to claim 1, wherein the calculation unit is configured to:
   determine the first hash function that changes depending on the at least part of the first data; and
   calculate the first hash value of at least part of the third data by using the determined first hash function, the third data being part of the first data,
   the second storage unit is configured to store the third data in the third storage area that has the associated address,
   the first storage unit is configured to store the associated address of the third storage area in the fourth storage area that has the first storage area address which matches the first hash value,
   the calculation unit is configured to calculate the first hash value of the at least part of the second data by using the determined first hash function, and
   the comparison unit is configured to:

identify the fourth storage area of the first storage areas that has the first storage area address that matches the calculated first hash value;

acquire the dictionary address that is stored in the identified fourth storage area;

identify the third storage area of the second storage areas that has the associated address that matches the acquired dictionary address;

acquire the third data from the identified third storage area; and compare the second data with the third data to acquire the length of the matching portion between the second data and the third data.

6. The compression device according to claim 1, further comprising a conversion unit configured to convert input fourth data into the first data.

7. The compression device according to claim 6, wherein the conversion unit is configured to generate conversion information for converting the first data into the fourth data.

8. A control method of controlling a compression device, the compression device comprising:

a first storage unit configured to include first storage areas that each store a dictionary address corresponding to a piece of dictionary data and that each have a first storage area address which matches a hash value; and a second storage unit configured to include second storage areas that each store data and that each have an associated address which matches the dictionary address stored in one of the first storage areas, the control method comprising:

determining a first hash function that changes depending on at least part of first data;

calculating a first hash value of at least part of second data by using the determined first hash function, the second data being a part of the first data;

acquiring third data from a third storage area of the second storage areas, wherein the third storage area has the associated address that matches the dictionary address that is stored in a fourth storage area of the first storage areas, and the fourth storage area has the first storage area address that matches the calculated first hash value; and comparing the second data with the third data to acquire a length of a matching portion between the second data and the third data, wherein the first data includes n-byte data comprised of one or more data portions, each of the one or more data portions has a length of m bits, n is an integer of one or more, m is an integer of two or more, the control method comprises:

calculating a first ratio of bits which are 0 among one or more i-th bits that are each included in one of the one or more data portions, or a second ratio of bits which are 1 among the one or more i-th bits;

determining the first hash function based on the first ratio or the second ratio; and acquiring encoded data by performing entropy encoding on a combination of the dictionary address stored in the fourth storage area and the length of the matching portion, and i is an integer of zero or more and less than m.

9. The control method according to claim 8, wherein the control method comprises; and determining the first hash function that does not use the i-th bit when the first ratio or the second ratio exceeds a first threshold.

10. The control method according to claim 8, wherein the control method comprises determining the first hash function in which a number of times of using the i-th bit is smaller than a number of times of using each of one or more bits other than the i-th bit when the first ratio or the second ratio is less than a second threshold.

11. The control method according to claim 8, comprising:

acquiring information related to an i-th bit having a bias in an appearance value in the one or more data portions; and determining the first hash function in which a number of times of using the i-th bit is smaller than a number of times of using each of one or more bits other than the i-th bit, by using the information.

12. The control method according to claim 8, comprising:

determining the first hash function that changes depending on the at least part of the first data; and calculating the first hash value of at least part of the third data by using the determined first hash function, the third data being part of the first data, wherein the second storage unit is configured to store the third data in the third storage area that has the associated address, the first storage unit is configured to store the associated address of the third storage area in the fourth storage area that has the first storage area address which matches the first hash value, and the control method comprises:

calculating the first hash value of the at least part of the second data by using the determined first hash function;

identifying the fourth storage area of the first storage areas that has the first storage area address that matches the calculated first hash value;

acquiring the dictionary address that is stored in the identified fourth storage area;

identifying the third storage area of the second storage areas that has the associated address that matches the acquired dictionary address;

acquiring the third data from the identified third storage area; and comparing the second data with the third data to acquire the length of the matching portion between the second data and the third data.

13. The control method according to claim 8, comprising converting input fourth data into the first data.

14. The control method according to claim 13, comprising generating conversion information for converting the first data into the fourth data.

15. A memory system comprising:

a controller including the compression device according to claim 1; and a nonvolatile memory, wherein the controller is configured to:

write the encoded data into the nonvolatile memory.

* * * * *